US006735543B2

(12) United States Patent
Douskey et al.

(10) Patent No.: US 6,735,543 B2
(45) Date of Patent: May 11, 2004

(54) METHOD AND APPARATUS FOR TESTING, CHARACTERIZING AND TUNING A CHIP INTERFACE

(75) Inventors: Steven Michael Douskey, Rochester, MN (US); Daniel Mark Dreps, Georgetown, TX (US); Frank David Ferraiolo, Essex Junction, VT (US); Curtis Walter Preuss, Rochester, MN (US); Robert James Reese, Austin, TX (US); Paul William Rudrud, Rochester, MN (US); James Donald Ryan, Rochester, MN (US); Robert Russell Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 09/996,839

(22) Filed: Nov. 29, 2001

(65) Prior Publication Data

US 2003/0101015 A1 May 29, 2003

(51) Int. Cl.$^7$ .............................................. G06F 19/00
(52) U.S. Cl. ........................ 702/120; 702/120; 702/123; 702/126; 702/185; 326/30; 326/31; 326/86; 714/715; 714/724; 714/728; 324/601; 324/712; 324/76.55; 324/76.82; 716/1; 716/4
(58) Field of Search ...................... 702/58, 59, 117–120, 702/123–126, 183, 185, 189, FOR 103, 104, 134, 170, 171; 714/715, 724, 728, 735–745; 710/25, 28, 29; 324/601, 602, 605, 606, 712, 76.47, 76.55; 326/30, 31, 33, 34, 83, 86, 87, 121; 307/443, 452, 481

(56) References Cited

U.S. PATENT DOCUMENTS 4,236,246 A * 11/1980 Skilling ........................ 371/27
4,348,759 A * 9/1982 Schnurmann ................ 371/20
4,435,806 A * 3/1984 Segers et al. ................ 371/25
4,939,389 A   7/1990 Cox et al. .................... 307/443
5,893,049 A * 4/1999 Reggiardo .................... 702/71
6,084,426 A   7/2000 Allen .......................... 326/31

OTHER PUBLICATIONS

McGee et al., Design of A Processor Bus Interface ASIC for the Stream Memory Controller, Apr. 1994, vol.: 2020, IEEE, pp. 462–465.*

Ishikawa et al., A 16 bit Low–Power–Consumption Digital Signal Processor for Portable Terminals, Apr. 1995, vol.: 2955, IEEE, pp. 798–802.*

(List continued on next page.)

Primary Examiner—Marc S. Hoff
Assistant Examiner—Elias Desta
(74) Attorney, Agent, or Firm—Roy W. Truelson

(57) ABSTRACT

An inter-chip line transmission circuit in a transmitting chip and complementary receiving circuit in a receiving chip provide the capability to characterize the inter-chip interface by separately generating identical pseudo-random test data at both chips, comparing the data, and recording errors. Preferably, one or both chips can be tuned on an individual line basis to reduce errors by altering threshold detection voltage, signal delay, and/or driver power. The receiver circuit preferably contains counters for counting test cycles and errors, which can be masked for any particular line or type of error. A tunable and characterizable interface in accordance with the preferred embodiment thus supports the accurate determination of low error rates on an individual line basis for various tuning parameter settings.

44 Claims, 24 Drawing Sheets

OTHER PUBLICATIONS

U.S. patent application 09/803,077, filed Mar. 9, 2001, entitled "Architecture for Built–In Self–Test of Parallel Optical Transceivers".

U.S. patent application 09/746,610, filed Dec. 20, 2000, entitled "Method and Apparatus for Elastic Shorts Testing, A Hardware–Assisted Wire Test Mechanism".

U.S. patent application 09/263,671, filed Mar. 5, 1999, entitled "Programmable Delay Element".

U.S. patent application 09/263,662, filed Mar. 5, 1999, entitled "Dynamic Wave–Pipelined Interface Apparatus and Methods Therefor".

U.S. patent application 09/263,661, filed Mar. 5, 1999, entitled "An Elastic Interface Apparatus and Method Therefor".

* cited by examiner

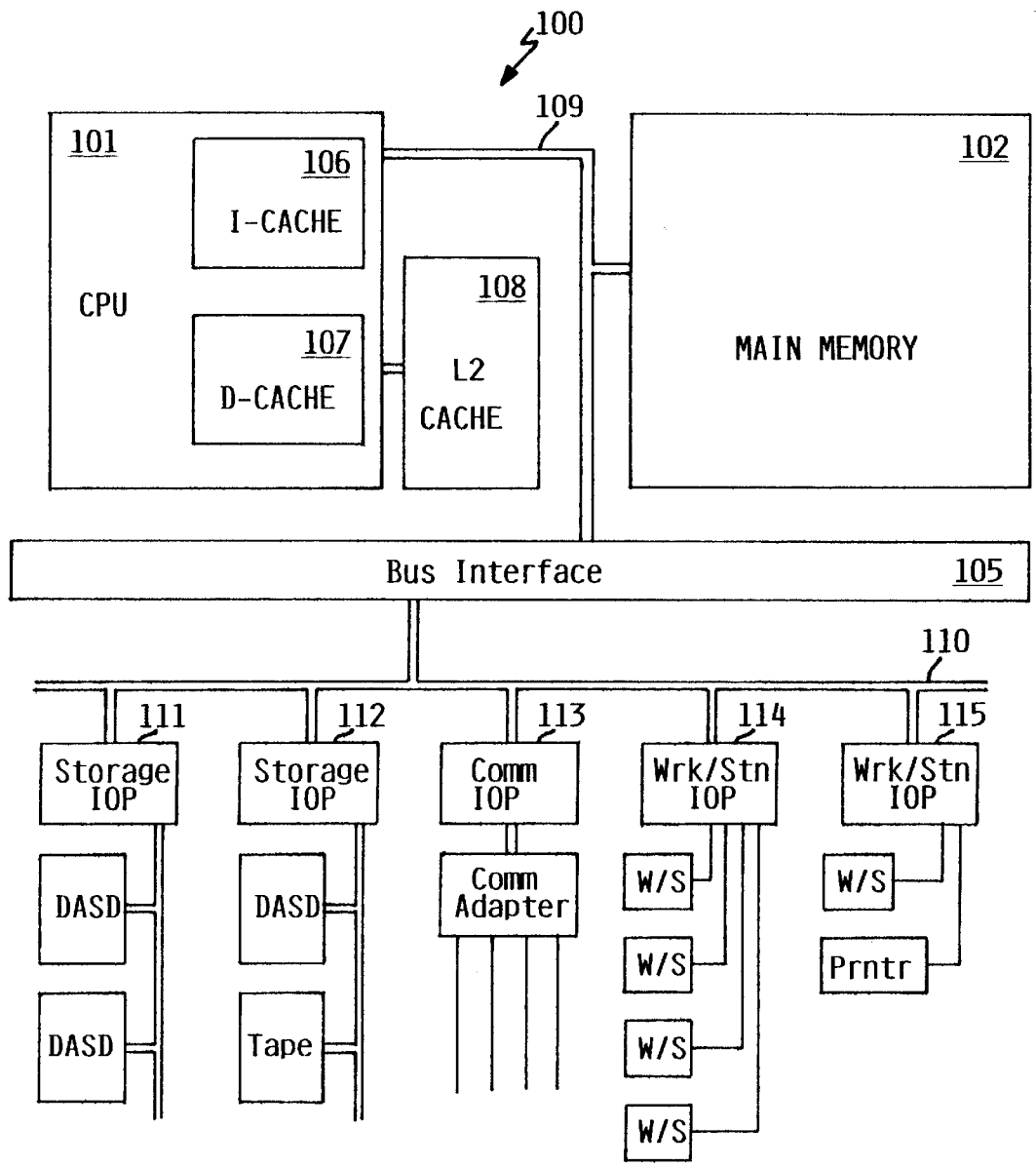
FIG. IA

METHOD AND APPARATUS FOR TESTING, CHARACTERIZING AND TUNING A CHIP INTERFACE

FIELD OF THE INVENTION

The present invention relates to digital data processing, and in particular to the design of chip interfaces for communicating data between an integrated circuit chip and other components of a digital data processing system.

BACKGROUND OF THE INVENTION

In the latter half of the twentieth century, there began a phenomenon known as the information revolution. While the information revolution is a historical development broader in scope than any one event or machine, no single device has come to represent the information revolution more than the digital electronic computer. The development of computer systems has surely been a revolution. Each year, computer systems grow faster, store more data, and provide more applications to their users.

A modern computer system typically comprises a central processing unit (CPU) and supporting hardware necessary to store, retrieve and transfer information, such as communications buses and memory. It also includes hardware necessary to communicate with the outside world, such as input/output controllers or storage controllers, and devices attached thereto such as keyboards, monitors, tape drives, disk drives, communication lines coupled to a network, etc. The CPU is the heart of the system. It executes the instructions which comprise a computer program and directs the operation of the other system components.

From the standpoint of the computer's hardware, most systems operate in fundamentally the same manner. Processors are capable of performing a limited set of very simple operations, such as arithmetic, logical comparisons, and movement of data from one location to another. But each operation is performed very quickly. Programs which direct a computer to perform massive numbers of these simple operations give the illusion that the computer is doing something sophisticated. What is perceived by the user as a new or improved capability of a computer system is made possible by performing essentially the same set of very simple operations, but doing it much faster. Therefore continuing improvements to computer systems require that these systems be made ever faster.

The overall speed of a computer system (also called the throughput) may be crudely measured as the number of operations performed per unit of time. Conceptually, the simplest of all possible improvements to system speed is to increase the clock speeds of the various components, and particularly the clock speed of the processor(s). E.g., if everything runs twice as fast but otherwise works in exactly the same manner, the system will perform a given task in half the time. Early computer processors, which were constructed from many discrete components, were susceptible to significant speed improvements by shrinking component size, reducing component number, and eventually, packaging the entire processor as an integrated circuit on a single chip. The reduced size made it possible to increase clock speed of the processor, and accordingly increase system speed.

Despite the enormous improvement in speed obtained from integrated circuitry, the demand for ever faster computer systems has continued. Hardware designers have been able to obtain still further improvements in speed by greater integration (i.e., increasing the number of circuits packed onto a single chip), by further reducing the size of circuits, and by various other techniques. For example, it has been possible to increase the width of various data buses to transfer more data with each bus cycle. Additional improvements have been made possible by increased parallelism, and specifically, by employing multiple processors. The modest cost of individual processors packaged on integrated circuit chips has made multi-processor systems practical, although such multiple processors add more layers of complexity to a system.

These various development trends in the design of computers and other digital data processing devices have had the effect of increasing the number of I/O pins on integrated circuit chips, and consequently, of increasing the number of data signal lines which communicate data from one chip to another.

Inter-chip communication lines are often arranged as buses having a defined protocol associated with a clock signal. To maximize overall system throughput, a fast clock is desirable, and designers are often pushing the envelope to obtain the fastest possible clock speed that the hardware will allow.

Where numerous inter-chip communication lines connect multiple ports on multiple chips, all simultaneously communicating data, various factors can degrade the signals received by a receiving chip. This degradation is not uniform. Each line has a different physical location on a circuit card or other carrier, it will lie adjacent a unique set of signal lines, and will have a unique driver circuit. It is therefore inevitable that some lines will exhibit a greater signal degradation, and will be more prone to soft (i.e., intermittent, non-repeatable) errors, than others.

In general, signal degradation may take the form of a phase shift, a voltage shift, or a purely random signal variation. A phase shift in the signal received by the receiving chip may be caused, e.g., by capacitance in the inter-chip signal line. Since each line has a different physical lay-out, the line capacitance (and the amount of phase shift) will vary with each line. A phase shift may also be caused by a clock skew within the transmitting chip, which again might vary from chip to chip. A voltage shift may be caused, e.g., by power variations in the transmitting chip's drivers. Random variations in the signal have many possible causes too numerous to mention, but in general certain conditions make a line more susceptible to variation, such as the physical length of the line, the strength of the drivers etc. It will therefore be expected that some lines exhibit more random variation than others.

At some point, the clock signal regulating a chip-to-chip interface can be made to run slow enough so that variations in phase shift of the signal from line to line will not cause problems for the receiver. However, slowing the clock signal to accommodate the worst case signal line may adversely affect system throughput. As the number of signal lines increases, the variation of the worst case line is likely to be more extreme, requiring further slowing of the clock.

Recently, some chips have been designed with "elastic" interfaces, in which the timing of the individual signal line receiver circuits can be varied to accommodate the individual variations in line capacitance and so forth. These elastic interfaces are typically tuned during the system design by measuring phase skew of the lines. Tuning elastic interfaces according to current techniques is a time-consuming process, which only promises to become more difficult as the number of inter-chip communication lines increases in future designs. Moreover, such tuning does not necessarily take other signal degrading factors into account, and does not necessarily obtain optimal results.

Historically, interfaces are often characterized and debugged in the development process using special test equipment, which is coupled to the signal lines to observe what is happening. As the number and density of lines increases, connecting test probes to individual lines is increasingly difficult and time consuming. Additionally, any test probe and attached testing apparatus has some finite impedance, which can distort the signal being characterized. When transmission errors are of an intermittent and infrequent nature, such conventional testing equipment is often inadequate to the task of characterizing the interface.

In order to design and produce systems of increased complexity, and in particular, having an increased number of inter-chip communication lines operating at high clock rates, it would be desirable to provide improved design techniques for inter-chip lines which overcome, tolerate, or otherwise accommodate individual line variations.

SUMMARY OF THE INVENTION

An inter-chip line transmission circuit in a transmitting chip and complementary receiving circuit in a receiving chip provide the capability to characterize the interface between the two chips by separately generating identical pseudo-random test data at both the transmitting circuit and receiving circuit, comparing the data, and recording errors.

In the preferred embodiment, one or both of the receiving and transmitting circuits can be tuned on an individual line basis to reduce errors. Specifically, it is preferred that both the threshold voltage and the delay of the input signal may be adjusted at the receiver. Additionally, both the threshold voltage and delay of the clock signal regulating the interface may be adjusted at the receiver. Finally, the power and impedance of the driver may also be adjusted.

The receiver circuit preferably contains a counter for counting test cycles and a counter for counting error cycles, which can be masked for any particular line. The counters support testing a large number of cycles to accurately determine the bounds of an error curve at low error frequencies. Additional mask logic makes it possible to mask for 1's or 0's to determine which type of error is predominant.

A tunable and characterizable interface in accordance with the preferred embodiment of the present invention thus supports the accurate determination of low frequency intermittent error rates on an individual line basis for various tuning parameter settings. Characterization of an interface can be accomplished under realistic simulated operating conditions, in which line signals are not distorted by attached test probes and similar devices. System designers may therefore fine-tune the inter-chip interfaces on an individual line basis after the chips and circuit boards to which they are mounted have been designed and constructed. While the primary benefit is assumed to be understanding and tuning the interface in the system design phase, such capability could further be used to test and/or tune circuits during manufacturing to account for manufacturing variations, or even to test and/or tune circuits in the field to account for variations in operating environment, aging, and so forth.

The details of the present invention, both as to its structure and operation, can best be understood in reference to the accompanying drawings, in which like reference numerals refer to like parts, and in which:

BRIEF DESCRIPTION OF THE DRAWING

FIG. 1A is a high-level block diagram of the major hardware components of a single-CPU computer system for utilizing a tunable inter-chip interface, according to the preferred embodiment of the present invention.

DETAILED DESCRIPTION OF THE PREFERRED EMBODIMENT

Figure 1B:
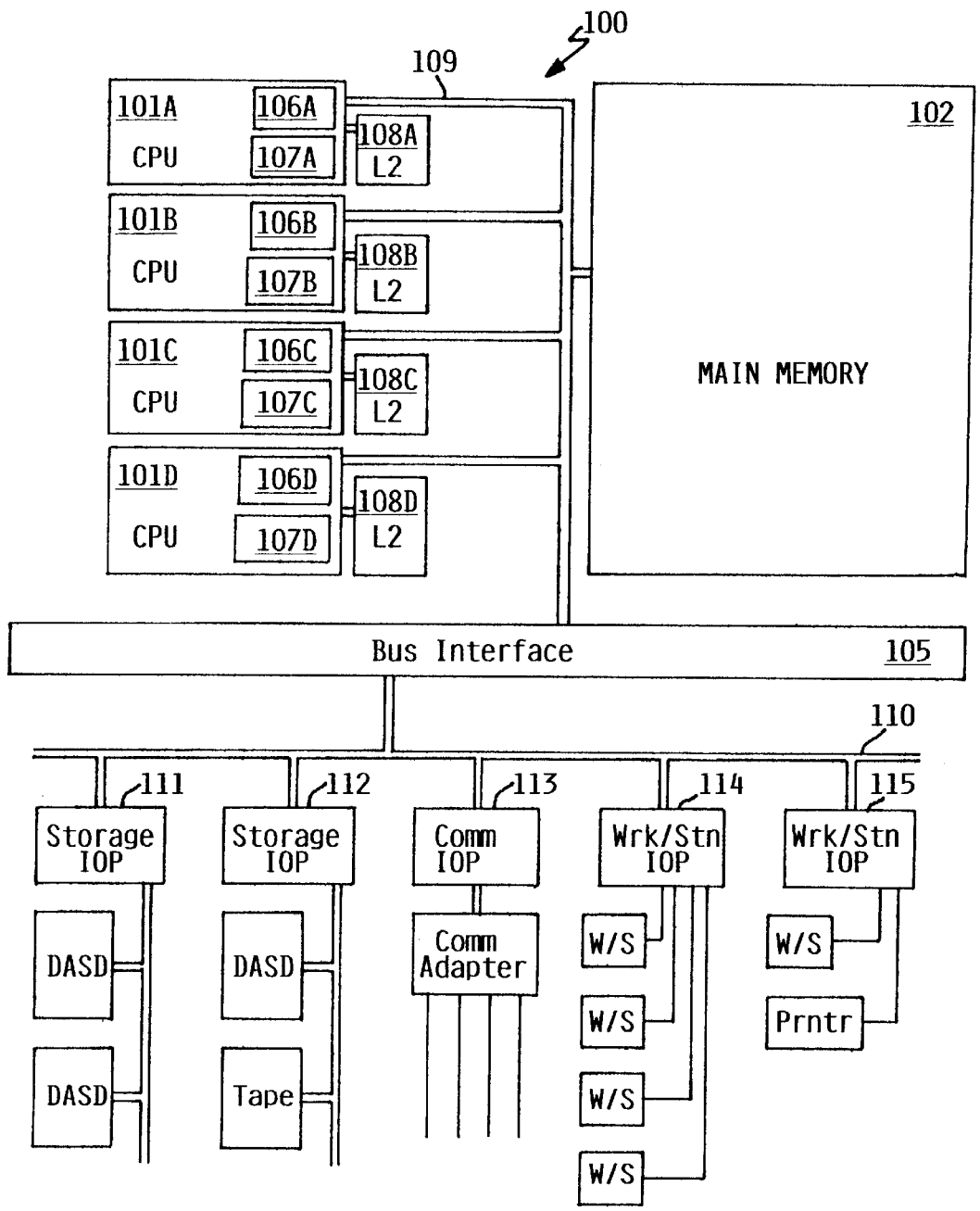
FIG. 1B is a high-level block diagram of the major hardware components of a multiple-CPU computer system for utilizing a tunable inter-chip interface, according to the preferred embodiment of the present invention.

Referring to the Drawing, wherein like numbers denote like parts throughout the several views, FIG. 1A is a high-level representation of the major hardware components of as single-CPU computer system 100 for utilizing a tunable inter-chip interface, according to the preferred embodiment of the present invention. CPU 101 processes instructions and data from main memory 102. CPU 101 temporarily holds instructions and data in a cache structure for more rapid access. In the embodiment of FIG. 1A, the cache structure is shown as separate internal level one instruction cache 106 (L1 I-cache) and level one data cache 107 (L1 D-cache), and level two cache 108 (L2 cache) closely coupled to CPU 101. However, I/O it should be understood that the cache structure may be different; that the number of levels and division of function in the cache may vary; and that a system might in fact have no cache at all. L1 I-cache 106 stores instructions for execution by CPU 101. L1 D-cache stores data (other than instructions) to be processed by CPU 101. L2 cache can be used to hold both instructions and data.

Memory bus 109 provides a data communication path for transferring data among CPU 101, main memory 102 and I/O bus interface 105, which is further coupled to system I/O bus 110 for transferring data to and from various I/O units. I/O bus interface unit 105 communicates with multiple I/O processing units (IOPs) 111–115 through system I/O bus 110. System I/O bus may be, e.g., an industry standard PCI bus. The IOPs support communication with a variety of storage and I/O devices, such as direct access storage devices (DASD), tape drives, workstations, printers, and remote communications lines for communication with remote devices or other computer systems.

It should be understood that FIG. 1A is intended to depict the representative major components of system 100 at a high level, that individual components may have greater complexity than represented FIG. 1A, and that the number, type and configuration of such components may vary. In particular, system 100 may contain multiple CPUs. Such a multiple CPU system is depicted at a high level in FIG. 1B. FIG. 1B shows a system having four CPUs 101A, 101B, 101C 101D, each CPU having respective L1 I-cache 106A, 106B, 106C, 106D, and respective L1 D-cache 107A, 107B, 107C, 107D. A separate L2 cache 108A, 108B, 108C, 108D for instructions and data is associated with each CPU. As used herein, CPU and caches are referenced by generic reference numbers as CPU 101, L1 I-cache 106, L1 D-cache 107 and L2 cache 108, it being understood that such devices could be contained either in a single CPU system as shown in FIG. 1A or a multiple CPU system as shown in FIG. 1B.

In FIGS. 1A and 1B, memory bus 109 is shown at a high level as providing a communications path among CPUs, main memory and I/O. It should be understood that this is a high-level representation only, and that in fact memory bus 109 may comprise multiple different buses or communication paths, which may be arranged in any of various forms, such as point-to-point links in hierarchical, star or web configurations, multiple hierarchical busses, parallel and redundant paths, etc. Furthermore, while I/O bus interface unit 105 and I/O bus 110 are shown as single respective units, system 100 may in fact contain multiple I/O bus interface units 105 and I/O buses 110. Additionally, main memory 102 may be divided into portions associated with particular CPUs or sets of CPUs and particular buses, as in any of various so-called non-uniform memory access (NUMA) computer system architectures.

While various system components have been described and shown at a high level, it should be understood that a typical computer system contains many other components not shown, which are not essential to an understanding of the present invention.

Figure 2:
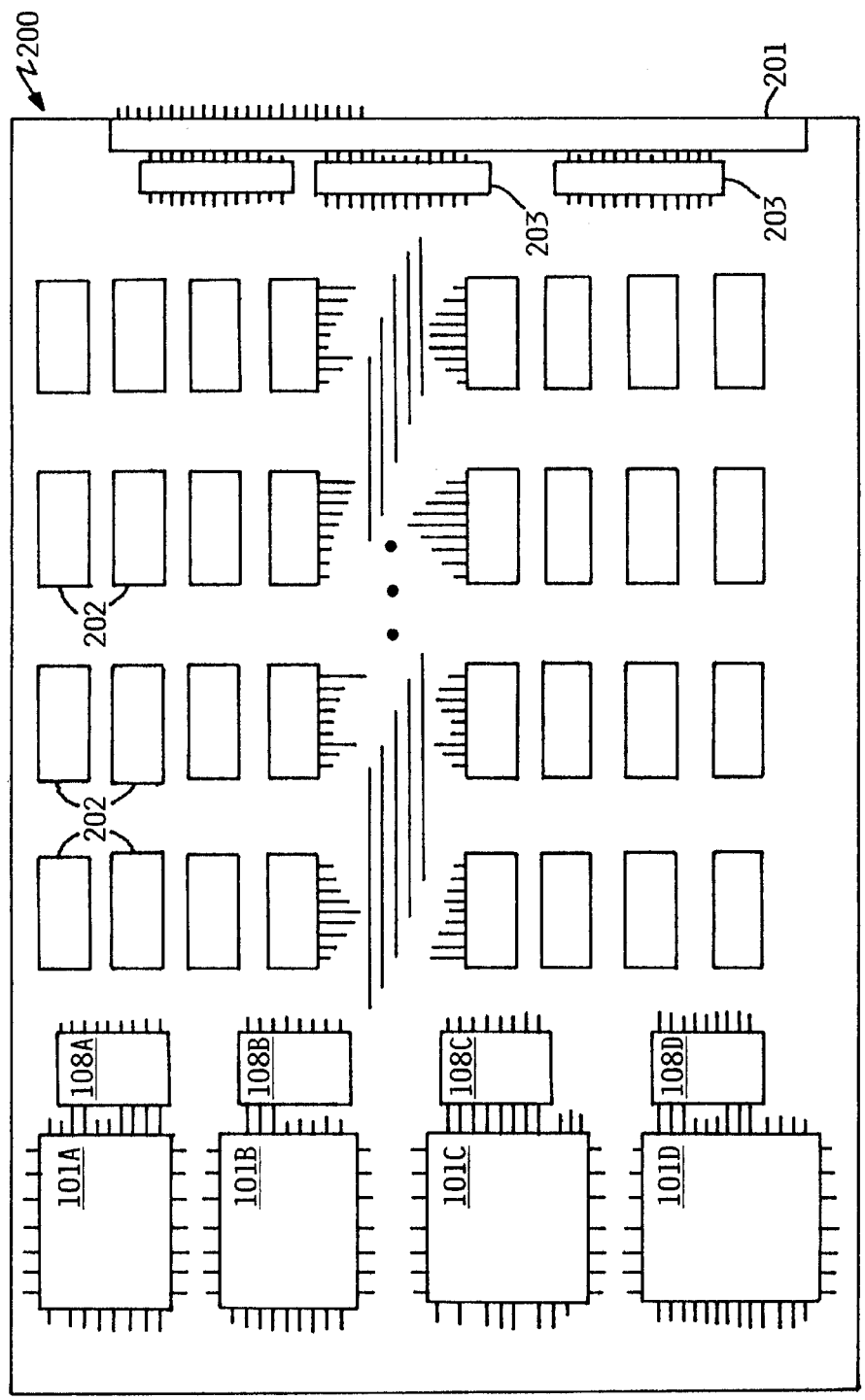
FIG. 2 is a simplified representation of a typical circuit card for mounting various components of a computer system, according to the preferred embodiment.

FIG. 2 is a simplified representation of a typical circuit card 200 for mounting various components of computer system 100, according to the preferred embodiment. Circuit card 200 is a thin, flat member having electrically conductive wire patterns on an insulator base material, such as fiberglass. Typically, a circuit card of any complexity has multiple layers of conductive patterns, which are separated by insulative layers to make a sandwich. Electronic components are mounted on one or both sides of circuit card 200. Any of various appropriate techniques now known or hereafter developed for construction of circuit cards and mounted of components thereon may be used.

Components mounted on circuit card 200 may include any of various integrated circuit modules, as well as discrete components such as resistors, capacitors, diodes, etc. (not shown). Circuit card 200 includes at least one connector 201 for communicating with other circuit cards or other components of computer system 100. FIG. 2 is intended as a high-level representation of a typical processor card of a multi-processor computer system, circuit card 200 having four processor modules 101A–101D, cache memory modules 108A–108D, main memory modules 202, and interface modules 203 for communicating with components external to card 200. However, it will be understood that the number and type of components mounted on a circuit card 200 in accordance with the present invention may vary, and that circuit card 200 need not be a processor card. For example, card 200 need not have any CPU modules, may contain one or more I/O processors or other communications modules with or without buffer memory, may contain only memory, etc.

Figure 3:
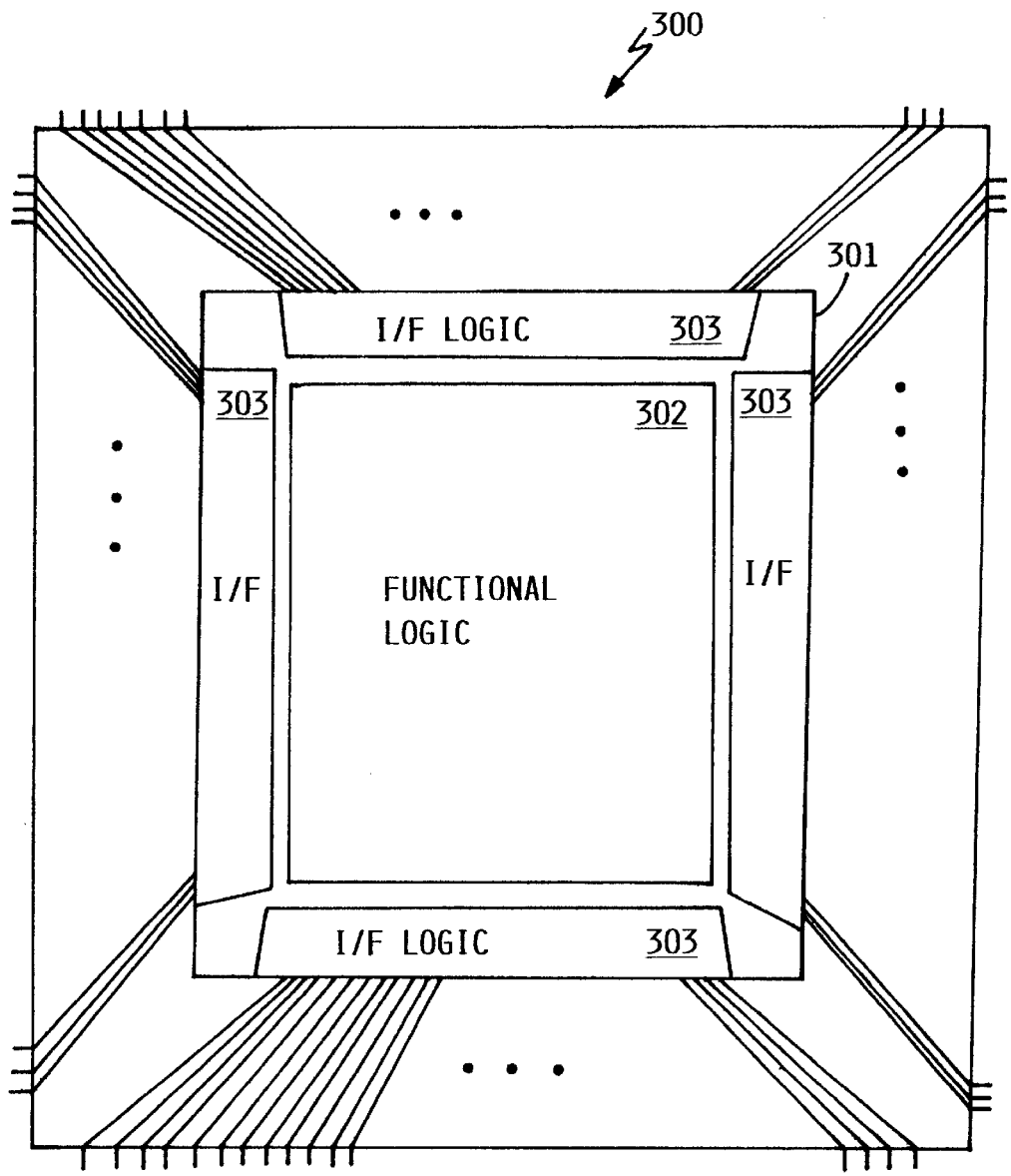
FIG. 3 is a simplified illustration of a typical integrated circuit module, according to the preferred embodiment.

FIG. 3 is a simplified illustration of a typical integrated circuit module, also called a "chip", such as is mounted on circuit card 200, according to the preferred embodiment. Integrated circuit module 300, contains various electronic circuits and elements formed on a single semiconductor substrate 301, which is typically silicon, although other materials are possible, and which is encapsulated in a protective insulator. The electronic circuits and elements on substrate 301 are broadly categorized as functional logic 302 and interface logic 303. Functional logic 302 performs the functions to which module 300 chip is dedicated. E.g., if module 300 is a CPU, functional logic will typically include instruction decoding logic, branching logic, arithmetic/logic units, registers, caches, and so forth. If module 300 is a memory module, functional logic 302 will typically include an array of memory cells, addressing decode logic, etc. Interface logic 303 provides an interface between functional elements of the module and elements external to module 300. Typically, interface logic 303 includes driver logic for driving an electrical signal to one or more external destinations, and receiver logic for receiving an external signal. Multiple conductive lines emanate from interface logic 303 and connect to I/O pins which extend from module 300. Although the I/O pins are shown in FIG. 3 along the four edges of module 300, such pins may be mounted differently, e.g., on fewer than all edges, or on the bottom of the module.

Figure 4:
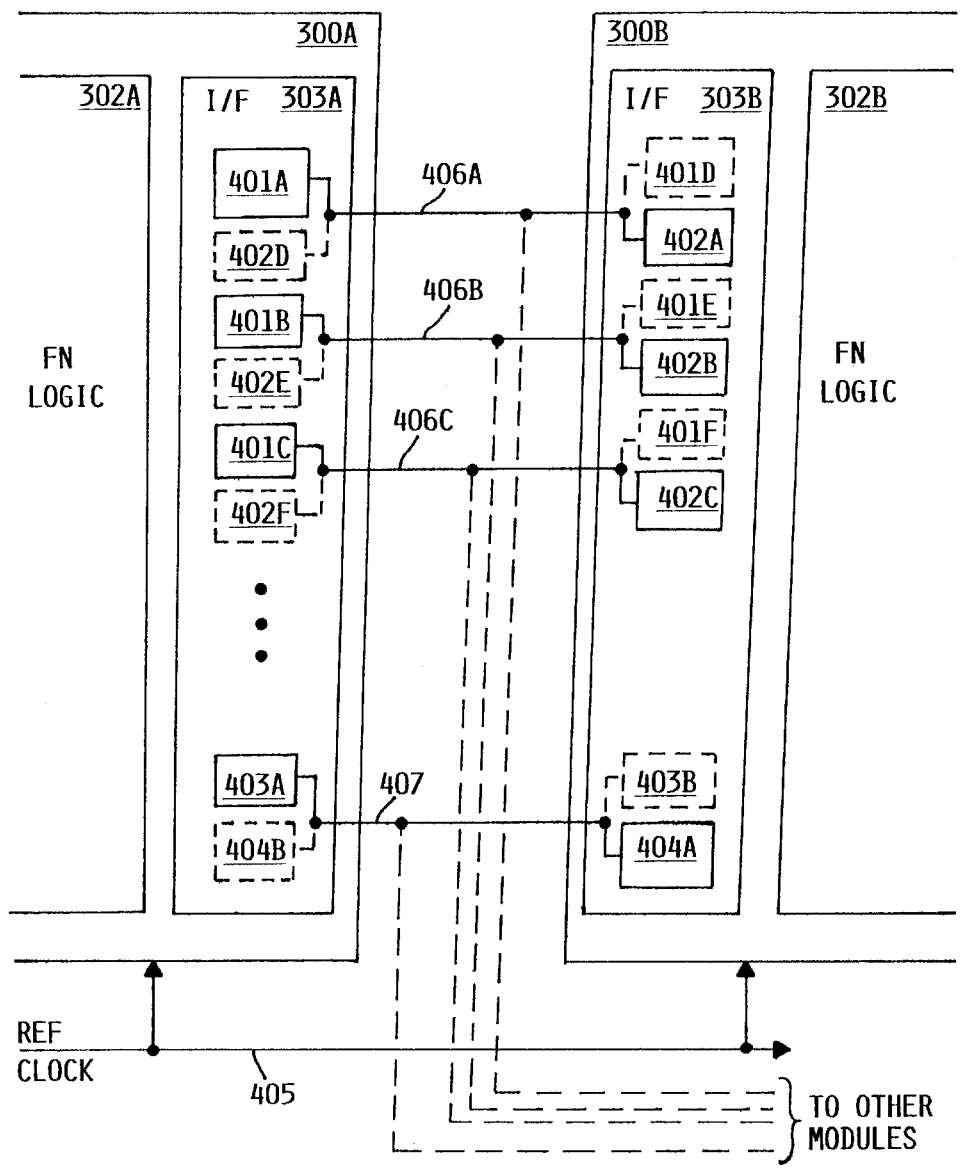
FIG. 4 is a simplified representation of two integrated circuit modules in communication with each other, according to the preferred embodiment.

Integrated circuit modules communicate with one another via external conductive lines in circuit card 200 which connect the interface logic of one module with the interface logic of another. FIG. 4 is a simplified representation of two modules 300A, 300B in communication with each other. Typically, data is communicated in parallel connections or buses, and so each data connection comprises multiple individual data bit lines 406A–406C in parallel, each line representing one pre-determined bit of information. Functional logic 302A in the transmitting module provides data to the transmitting module's interface logic 303A. Each line 406A–406C is driven to appropriate voltage levels representing a logical value by respective driver circuit 401A–401C. In the receiving interface logic 303B, receiver circuit 402A–402C for each line receives the driven signal and provides a respective logic signal to functional logic 302B in the receiving module 300B. For clarity of illustration, only three lines 406A–406C and corresponding drivers and receivers are illustrated in FIG. 4, in being understood that the actual number of lines is typically larger.

A conductive clock line 407 is associated with a set of data bit lines 406A–406C, the clock line being used to transmit a clock signal for the data being transmitted on the bit lines. Clock line 407 is driven by a driver circuit 403A in the transmitting module, and received by a receiver circuit 404A in the receiving module.

A conductive line or set of lines may be unidirectional, meaning that data runs only in one direction, or bi-directional. In the latter case, the interface logic 303A, 303B in each module will contain both driver logic and receiver logic. This is illustrated in FIG. 4 as dashed data receiver circuit elements 402D–402F and clock receiver element 404B in interface logic 303A, and as dashed data driver circuit elements 401D–401F and clock driver 403B in interface logic 303B. For clarity, data driver circuit is herein referred to generically as element 401, data receiver circuit as element 402, clock driver as element 403, clock receiver as element 404, and conductive bit line as element 406.

A conductive line or set of lines may run between two and only two modules, or may connect multiple modules, as shown by dashed line connections in FIG. 4. For example, multiple transmitting modules may transmit data through a line to a single receiving module; or a single transmitting module may transmit data through a line to multiple receiving modules, or multiple transmitting modules may transmit data through a line to multiple receiving modules. Where multiple modules have the potential to transmit data through a shared line, some protocol must exist to prevent simultaneous transmission by two or more modules. E.g., the line may be allocated to different modules on a cycle-interleaved or similar time-sliced basis, or an arbitration process may be defined whereby a module wishing to transmit can obtain control of the line for a continuous number of cycles.

Each individual line 406 communicates data in a sequence of logic 1's and 0's, the sequence being synchronized with a clock signal on clock line 407. Preferably, the clock signal on line 407 is derived from an external reference clock signal 405 which is used by both modules 300A, 300B. I.e., the clock signal on line 407 is either the same period as the reference clock signal on line 405, or some integral multiple of periods of the reference clock. Although derived from the reference clock, clock signal 407 is typically phase shifted some amount due to various transmission delays within module 300A.

Figure 5:
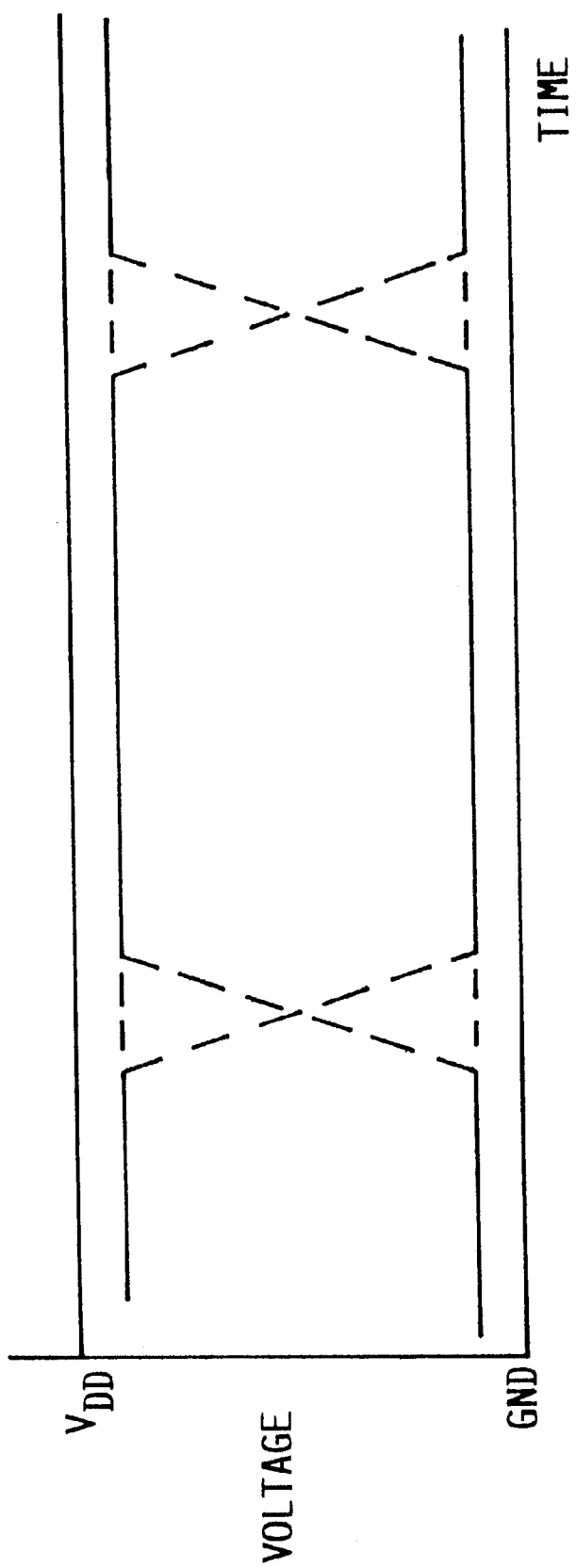
FIG. 5 is an idealized "Eye-diagram" for characterizing an inter-module communication line.

A line signal received by receiver circuit 402 may be characterized using an "Eye-diagram". FIG. 5 is an idealized "Eye-diagram". In an Eye-diagram, the x-axis represents time, while the y-axis represents signal voltage detected by a receiver circuit. As shown in FIG. 5, the received voltage varies within a range which lies between the voltage of a power source ($V_{DD}$) 501 and ground 502. When a logic "1" is communicated on the line, it is driven to a voltage near $V_{DD}$; when a logic "0" is communicated, it is driven to a voltage near ground. Communications are synchronized to clock signal 407, so that at periodic intervals the voltage on the line may change state from a logic "1" to a logic "0", or vice-versa, or may stay the same. This is shown in FIG. 5 as the dashed line voltage shifts. Although the interval of voltage shift is the same as a clock cycle, the voltage shift may be phase offset from some clock transition due to various propagation delays in the driver circuits and transmission lines.

Figure 6:
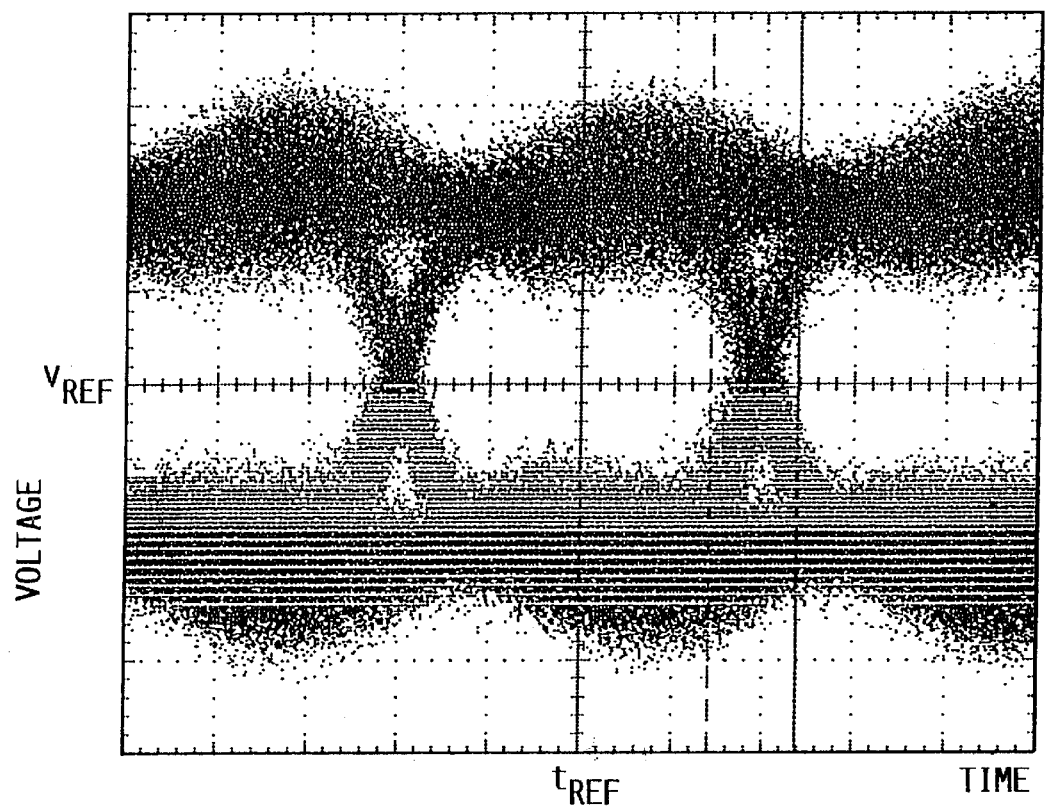
FIG. 6 represents an Eye-diagram scatter plot of a typical communications line interface.

In a real system, the line voltage will not achieve such perfect uniformity as shown in the idealized Eye-diagram of FIG. 5. FIG. 6 represents an Eye-diagram scatter plot of data measurements from a typical communications line interface. The Eye-diagram plot of FIG. 6 is a scattergram of discrete data measurements over many clock cycles, which trace the basic outline of an Eye-diagram. Some data measurements therefore correspond more closely to the ideal Eye-diagram than others.

Referring to the scatter plot of FIG. 6, it will be observed that discrete data measurement points are thickest at the high and low logic levels, and another set of points is found near the transitions. In the middle region between the high and low logic levels, and between the transitions, there are virtually no data points.

A communications line receiver circuit 402 operates by comparing a reference voltage $V_{REF}$ to the voltage on line 406 at periodic intervals (sample times) $t_{REF}$, where $t_{REF}$ is some offset phase from the clock signal. Referring to FIG. 6, if $V_{REF}$ is represented as a horizontal line in the Eye-diagrams and $t_{REF}$ as a vertical line, the intersection of the two lines should lie somewhere near the middle of the white space between high and low logic levels and between voltage transitions. Specifically, this means than receiver circuit 402 should be designed so that $V_{REF}$ and $t_{REF}$ intersect near the middle of the open area in the Eye-diagram. The closer $V_{REF}$ is to the one of the nominal logic levels, the greater is the probability that random noise will cause a signal to cross the $V_{REF}$ threshold when it should not, and consequently cause a transmitted bit to be misread by the receiver circuit. Similarly, the closer $t_{REF}$ is to one of the transitions, the greater is the probability that some random event will alter the normal timing of the transition, and again cause a transmitted bit to be misread. Finally, since the circuits which generate $V_{REF}$ and $t_{REF}$ can not be replicated with absolute precision for each and every one of a large number of manufactured systems, it is desirable that the system is designed so that $V_{REF}$ and $t_{REF}$ are nominally near the middle of the open area of the Eye-diagram, in order to allow as much room as possible for manufacturing variations.

Figure 7:
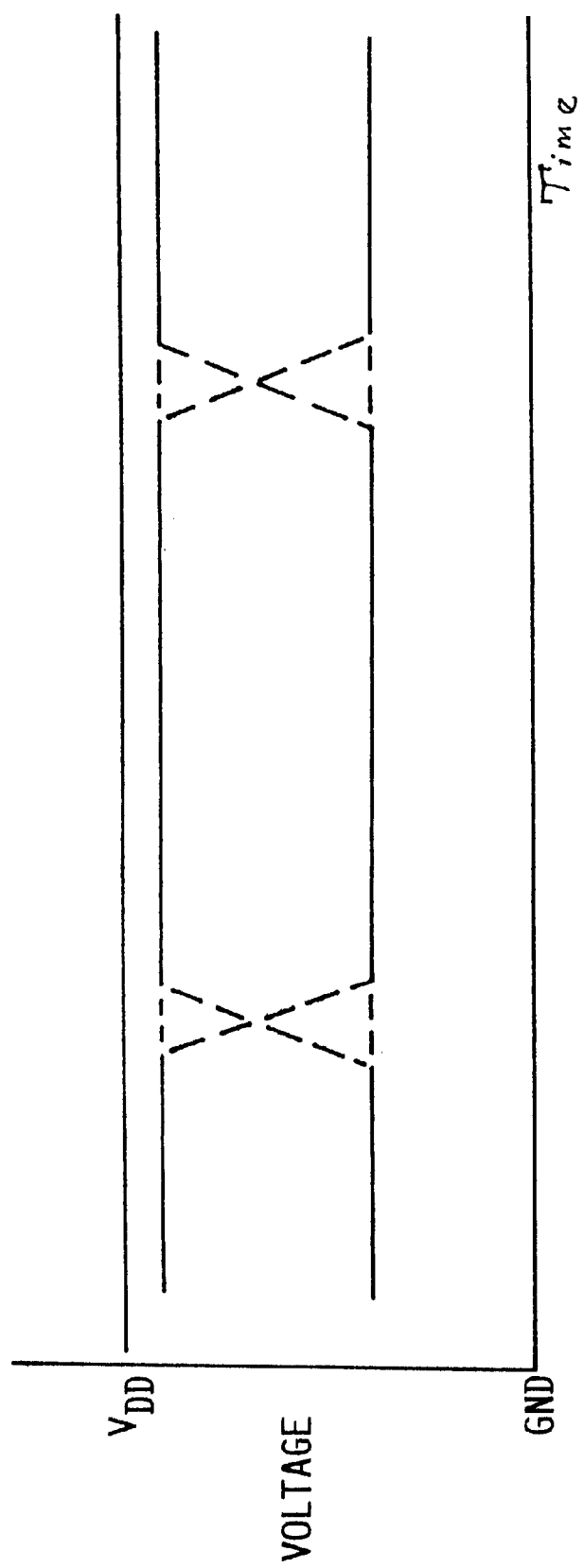
FIG. 7 is an Eye-diagram representing one type of line degradation, in which the low logic level transmitted on the line is far above ground.
Figure 8:
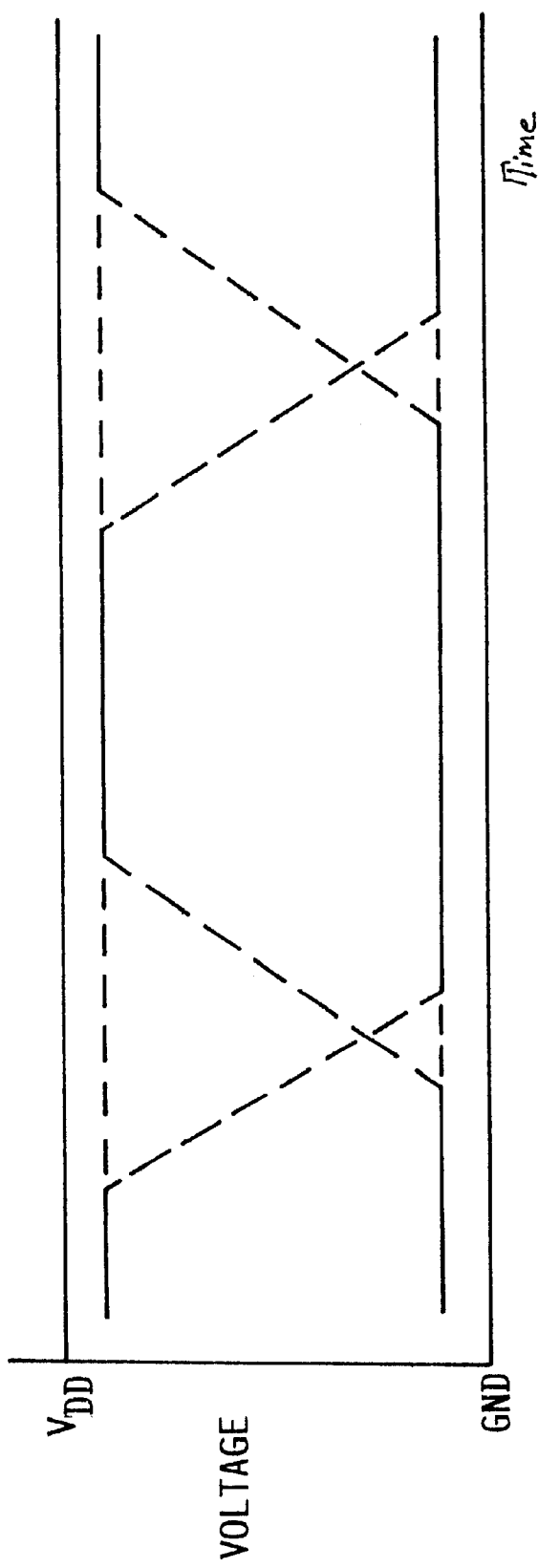
FIG. 8 is an Eye-diagram representing another type of line degradation, in which voltage transitions in one direction occur at a different time (phase of the clock cycle) than voltage transitions in the opposite direction, and/or at a different rate.

If one considers $V_{REF}$, it may appear that the optimal value of $V_{REF}$ is mid-way between supply voltage and ground, i.e., $V_{DD}/2$. However, this is not necessarily the case, because the line voltage characteristic may vary in certain ways from the idealized characteristic of FIG. 5. Various factors other than random noise may degrade the characteristic voltages on the line. FIG. 7 is an Eye-diagram representing one type of degradation, in which the low logic level transmitted on a line is far above ground. This may occur when the driver circuit can not sink enough current to drive the line nearer to ground, e.g. because the driver is weak, or because the line is connected to many modules, each with a driver and/or receiver circuit which leaks some current, or some combination of these or other circumstances. Although FIG. 7 represents a line in which the ground sink driver is too weak for the load, it will be appreciated that the same problem may occur in reverse, i.e., the $V_{DD}$ pull-up driver may also be too weak for the load. FIG. 8 is an Eye-diagram representing another type of degradation, in which voltage transitions in one direction occur at a different time (phase of the clock cycle) than voltage transitions in the opposite direction, and/or at a different rate. This may occur because the power and impedance characteristics of the drive transistor(s) for pulling the line high are not the same as those of the drive transistor(s) for pulling the line low. In this case, the ideal $V_{REF}$ may be something closer to ground than $V_{DD}$, because it will allow greater tolerance variation of the sample time, $t_{REF}$.

Referring again to FIG. 6, it will be observed that for a given $V_{REF}$ and $t_{REF}$ of a specific physical line connection, the intersection of the lines will lie in an area which is almost entirely devoid of data points, or which may have a few scattered data points, or which may have many data points. Any data point on the wrong side of a reference line represents the occurrence of a bit signal which may be misinterpreted by the receiver circuit, i.e. an error. Therefore, for a given $V_{REF}$ and $t_{REF}$ of a line, there will be a frequency, or rate, at which data points occur on the wrong side a the reference line, i.e. there will be an error rate. By varying one of the parameters $V_{REF}$ or $t_{REF}$, the error rate may be plotted as a function of the parameter. Typically, $t_{REF}$ is varied, although it would alternatively be possible to plot error rate as a function of $V_{REF}$ at a given $t_{REF}$.

Figure 9:
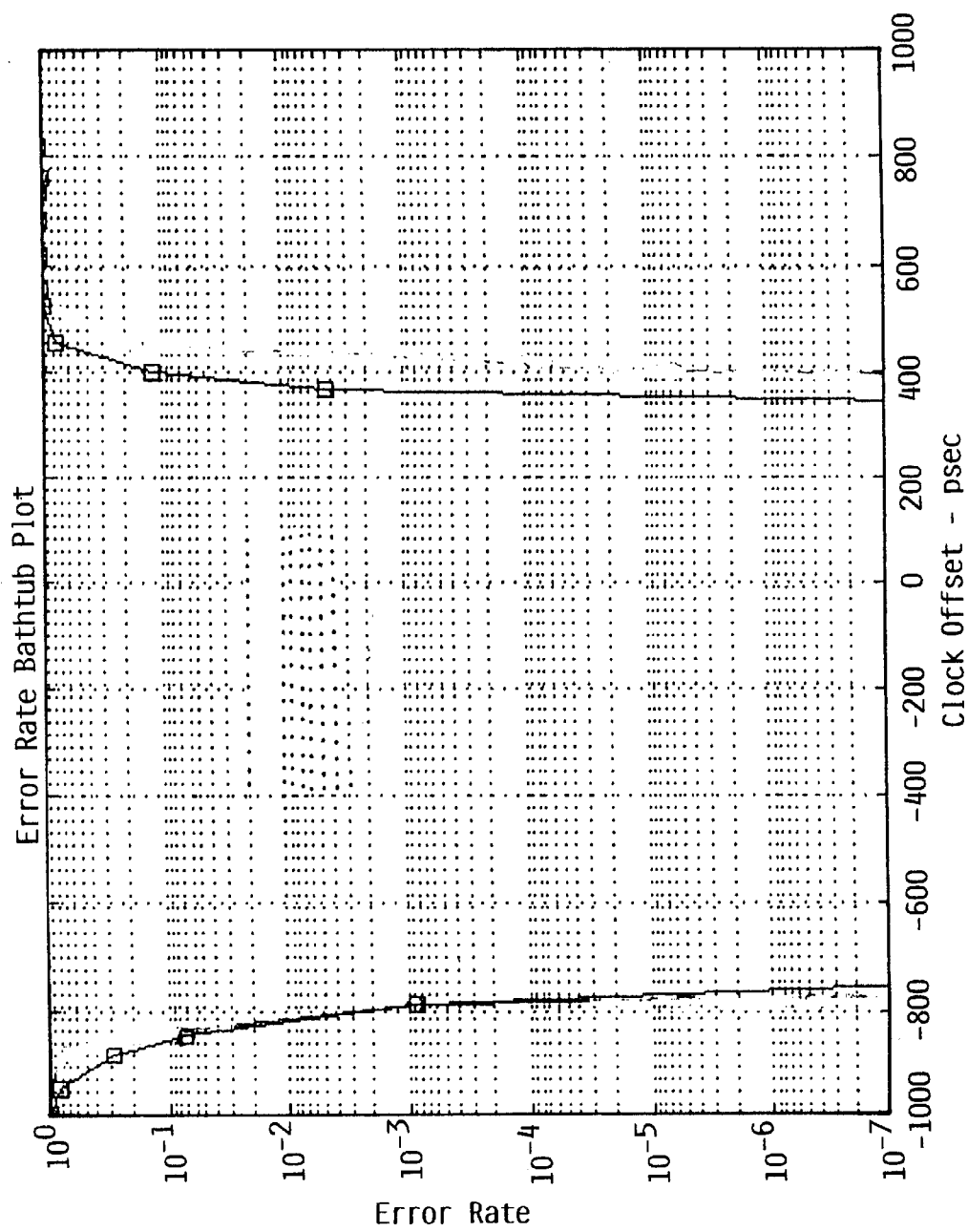
FIG. 9 is a typical "bathtub" plot of error rate as a function of clock offset.

FIG. 9 is a typical "bathtub" plot of error rate as a function of $t_{REF}$ for a specific physical line connection. In FIG. 9, $t_{REF}$ is represented as an offset time period or phase from the clock signal which regulates the line. The error rate is represented on a logarithmic scale, in which the top of the graph is $10^0$, i.e. 1, indicating that virtually every bit received is in error, and the lower portions indicated exponentially lower error rates, e.g., $10^{-1}$, $10^{-2}$, $10^{-3}$, etc. Typically, if the clock offset from some nominal clock phase is too great in either direction, the error rate approaches 1, while in a middle range, the error rate drops to a very low frequency. This gives the curve its characteristic "bathtub" shape. The graph of FIG. 9 bottoms out at an error rate of $10^{-7}$, but the actual error rate may be lower in the middle range, and may be so low as to be difficult to measure. The range of clock offset values at the bottom of the curve is significant, because for practical applications a system must have error rates well below $10^{-7}$.

Figure 10:
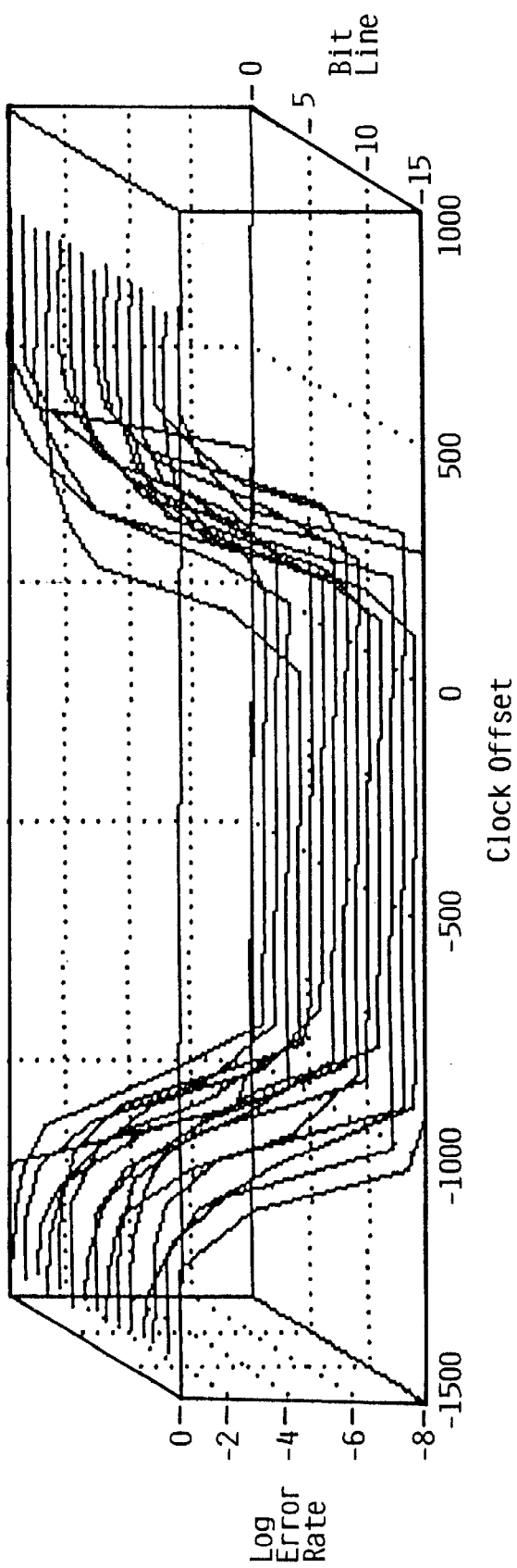
FIG. 10 represents a set of bathtub curves for different bit lines of a common data bus.

As previously noted, the line characteristics of each individual line may vary from those of any other line, even when the lines are part of a common group of lines or bus connecting the same pair or set of integrated circuit modules. FIG. 10 represents a set of bathtub curves for different bit lines of a common data bus, arranged side-by-side to form a 3-dimensional figure. It will be observed that each bathtub curve follows the same general profile, in that each curve approaches an error rate of 1 at sufficiently high offsets in either direction from the nominal clock phase, and that the error rate is low in the middle. However, it will also be observed that the various bathtub curves vary in their precise measurements. Specifically, the range of the curve "bottom", meaning that the error rate is below $10^{-8}$, varies for each line.

It is desirable to obtain error rates well below $10^{-7}$ or $10^{-8}$. Due to the many variations in individual lines as well as manufacturing tolerances, it is difficult to select nominal values for $V_{REF}$ and $t_{REF}$ which will guarantee sufficiently low error rates in all cases. For any given line, as $V_{REF}$ moves away from its optimal value, the range of clock offset values $t_{REF}$ which will provide a sufficiently low error rate becomes narrower. At some point, the bathtub curve will not bottom out at a sufficiently low error rate at all. Similarly, as $t_{REF}$ moves away from its optimal value, it may eventually reach the rise in the bathtub curve and produce unacceptable errors. These optimal values will vary for each individual line, and manufacturing tolerances provide further variation for each individual manufactured system.

In accordance with the preferred embodiment of the present invention, this problem is addressed in a two-pronged approach. An inter-chip interface is designed having the capability to characterize error rates for each individual line 406 under different conditions, and in particular, to measure low error rates under realistic operating conditions. Additionally, an inter-chip interface is designed having the capability to adjust certain line parameters in order to reduce error rates.

Figure 11:
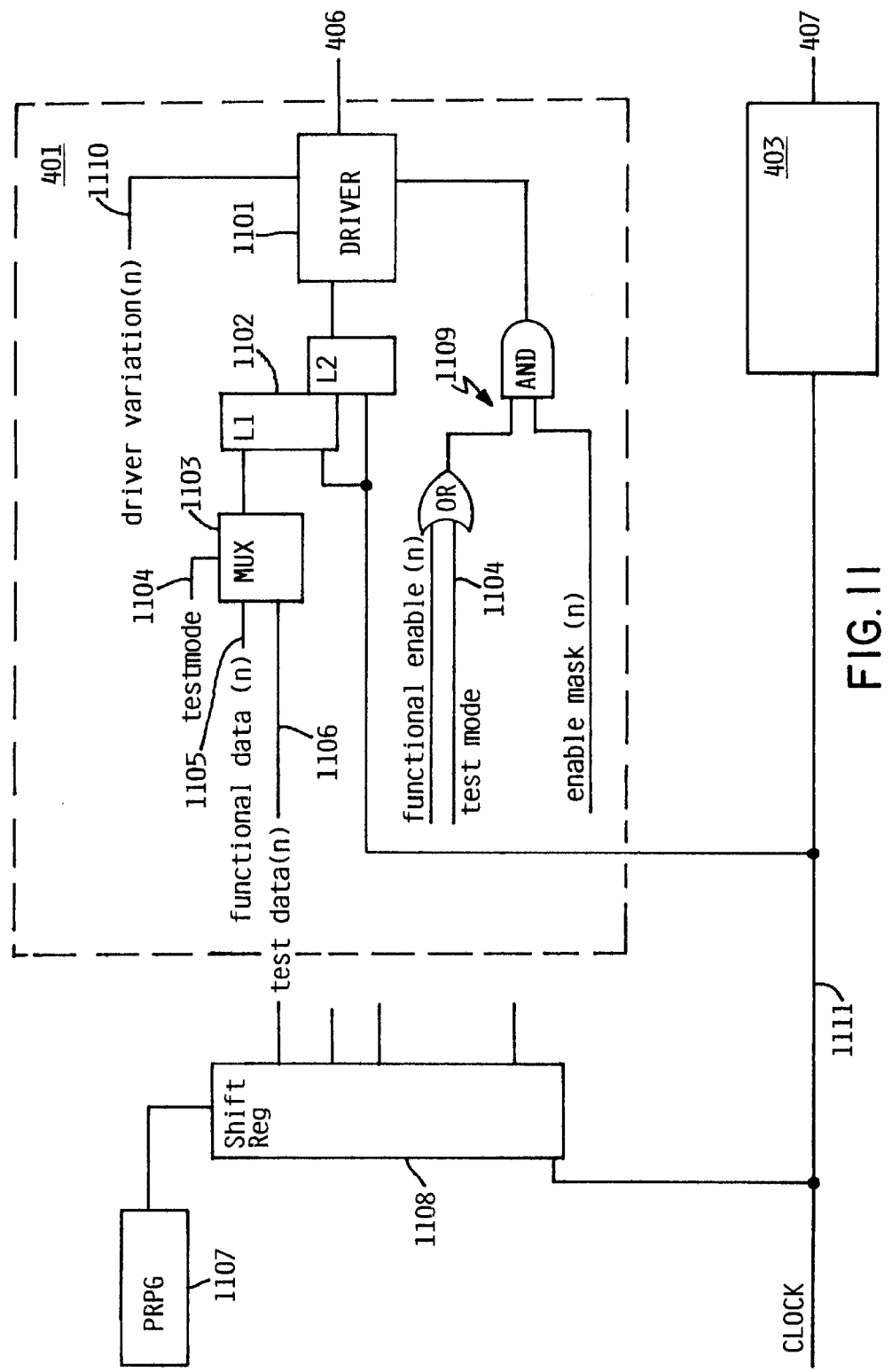
FIG. 11 is a high-level circuit diagram showing the major elements of a driver circuit for an output line of an inter-chip interface, according to the preferred embodiment.

FIG. 11 is a high-level circuit diagram showing the major elements of a driver circuit 401 for a data line 406 of an inter-chip interface 303, according to the preferred embodiment of the present invention. Driver circuit 401 includes a variable power/impedance driver 1101 which drives the data line on an external chip pin. Driver 1101 receives data input from master/slave latch 1102, which is clocked by clock signal 1111 and which receives input from multiplexer 1103. Clock signal 1111 is derived from external reference clock 405, and is used both for clocking latch 1102 (and hence output from circuit driver 1101 on line 406, and for supplying input to clock driver 403 which drives clock line 407.

Multiplexer 1103 selects one of two inputs, depending on the state of a test mode signal 1104. In normal operational mode, test mode signal 1104 is inactive, and multiplexer 1103 selects data on functional data line 1105, which is supplied by functional logic 302. In a test mode, test mode signal 1104 is active, and multiplexer 1103 selects test data 1106.

Test data is supplied by pseudo-random pattern generator 1107 and shift register 1108. Pseudo-random pattern generator generates a stream of "pseudo-random" bits, which are shifted into shift register 1108 for output to multiple driver circuits 401 when in test mode. As used herein, "pseudo-random" means that the bit stream is generated according to a deterministic and repeatable process, but that there is no apparent pattern to the bit stream, and it appears random. Specifically, the bit stream pattern may repeat after a large number of cycles. In the preferred embodiment, pseudo-random pattern generator 1107 contains a plurality of latches and an XOR gate network for changing latch state from one cycle to the next, the number of possible latch states being limited by $(2^L-1)$, where L is the number of latches, where the pseudo-random pattern repeats every $(2^L-1)$ cycles. Because data generated by pseudo-random pattern generator 1107 will be compared with similar data in the receiver for test purposes, this data must necessarily be generated by a deterministic and repeatable process. However, it is desirable that the data appear random in order to stress the system under as many variable conditions as possible, and to emulate real operating conditions. Therefore, $(2^L-1)$ should be significantly larger than the number of lines in any inter-chip interface being tested. A modern processor may have 500 or more I/O lines, and so it is preferable that L be at least 10, and more preferably, that L be 16 or more to obtain a better sample of possible combinations of I/O states.

Shift register 1108 has a plurality of outputs, one for each output bit of interface 303, and therefore one of the bit outputs of shift register 1108 corresponds to driver circuit 401, the other bit outputs supplying test data for other driver circuits. In a simple embodiment, pseudo-random data generated by generator 1107 is shifted one bit at a time through shift register 1108, so that the output for line (n+1) during cycle (m+1) is the same as the output for line n during cycle m. In an alternative embodiment, spreading function logic (not shown) may be used to phase shift the data generated by generator 1107, so that each signal line is less related to its neighbors. I.e., spreading function logic causes any particular line n to output the sequence of bits n, p+n, 2p+n, 3p+n, etc. generated by generator 1107, so that adjacent lines do not see the same sequence of bits which are merely phase-shifted. In yet another embodiment, shift register 1108 could be configured as a pseudo-random pattern generator as well.

Driver 1101 is regulated by an enable signal from AND-OR gates 1109, and by driver variation input line(s) 1110. The enable signal from AND-OR gates 1109 enables or disables driver 1101, i.e., in an enabled state, driver 1101 operates to pull the output voltage to a high or low logic level, as the case may be according to the data bit in latch 1102. In a disabled state, driver 1101 is in a high impedance state, allowing the output line to be driven by other modules to which it may be connected. AND-OR gates 1109 receive a functional enable signal, an enable mask signal, and a test mode signal. The functional enable signal is a signal generated by functional logic 302 to selectively enable or disable the driver, according to system functional requirements at any given time. I.e., during normal module operation, functional logic 302 will be providing data for external transmission on any given line 406 only part of the time. At other times, module 300 may be receiving data from another module, or module 300 may be inactive will two or more other modules on the same bus are sending and receiving data, or the bus may simply be quiescent. The enable mask signal is used only in a test mode for selectively enabling or disabling a driver. It may be desirable to selectively disable drivers in test mode so that specific sources of noise can be masked out, in order to isolate the source of certain problems. Note that the AND-OR configuration may be optimized for better functional enable timing.

Driver variation comprises one or more lines which can be used to alter the power/impedance characteristics of driver 1101, as explained more fully below.

Figure 12:
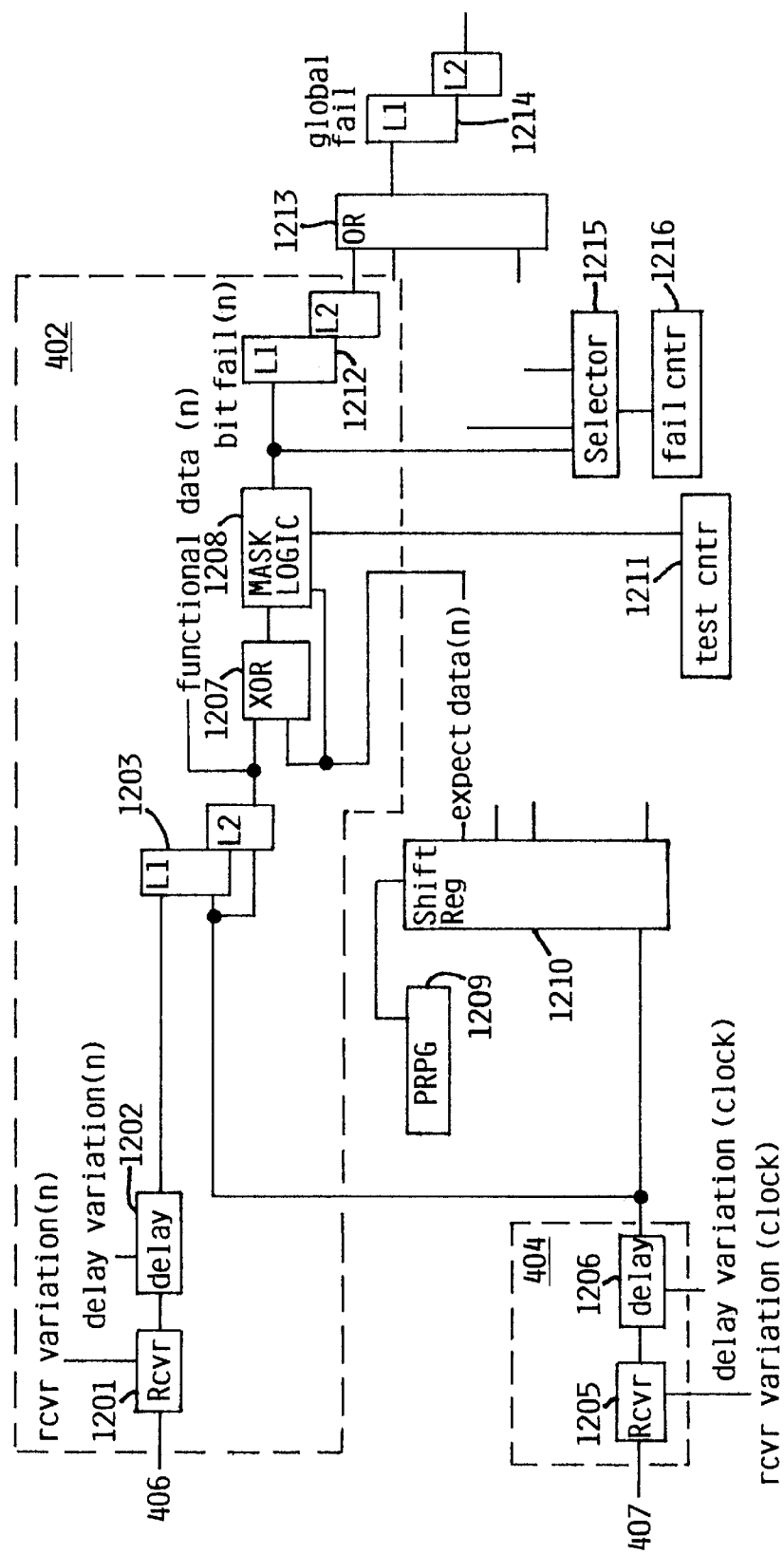
FIG. 12 is a high-level circuit diagram showing the major elements of a receiver circuit for a line of an inter-chip interface, according to the preferred embodiment.

FIG. 12 is a high-level circuit diagram showing the major elements of a receiver circuit 402 for data bit line 406 of an inter-chip interface 303, according to the preferred embodiment of the present invention. Receiver circuit 402 includes a variable reference differential receiver 1201 which receives the external data signal on line 406, and which provides input to a variable delay circuit 1202, which in turn provides input to master/slave latch 1203.

Latch 1203 is clocked by an externally received clock signal on clock line 407. A differential receiver 1205 similar to differential receiver 1201 receives the clock signal, and a variable delay circuit 1206 similar to delay circuit 1202 provides a clock delay before the clock triggers master/slave latch 1203. Each receiver circuit 402 for a single data bit line 406 contains a respective differential receiver 1201, delay circuit 1202 and latch 1203; however, external clock signal 1204, along with differential receiver 1205 and delay 1206, are typically shared among many external inter-chip bit line inputs to the receiving module.

Pseudo-random pattern generator 1209 provides a bit stream of pseudo-random data identical to that generated by generator 1107 in the transmitting module. I.e., generator 1209 uses the same deterministic and repeatable process as generator 1107 to produce an exact copy of the bit stream generated by the transmitting module. It is preferable to produce two identical copies by mirrored deterministic processes in each module, than to transmit a copy of a pattern on a separate pattern line from one module to another, because in the latter case it will be difficult or impossible to determine whether an error was caused in the transmission of the line under test or the transmission of the pattern line. Like shift register 1108, shift register 1210 has multiple outputs, one for each line 406 of interface 303, and therefore one of the bit outputs of shift register 1210 corresponds to receiver circuit 402, the other bit outputs supplying test data for other receiver circuits. As in the case of the driver circuits explained above, it would alternatively be possible to use spreading logic to phase shift the bit stream or incorporate the pseudo-random pattern generator function into the shift register, but of course whatever logic is used must correspond to the logic in the transmitting module.

The output of latch 1203 provides one bit of functional data to functional logic 302 in the receiving module. This output also provides input to XOR gate 1207. The other input to XOR gate is from shift register 1210. Thus XOR gate functions as a logical compare of the data received (as decoded by differential receiver 1201, and delay 1202, and latched in latch 1203) and the data that should have been received based on the identical pseudo-random data pattern generated by generator 1209. As long as both data bits are identical, the output of XOR 1207 is logical zero; if the bits are not identical, XOR 1207 outputs a logical one, signifying an error.

Figure 13:
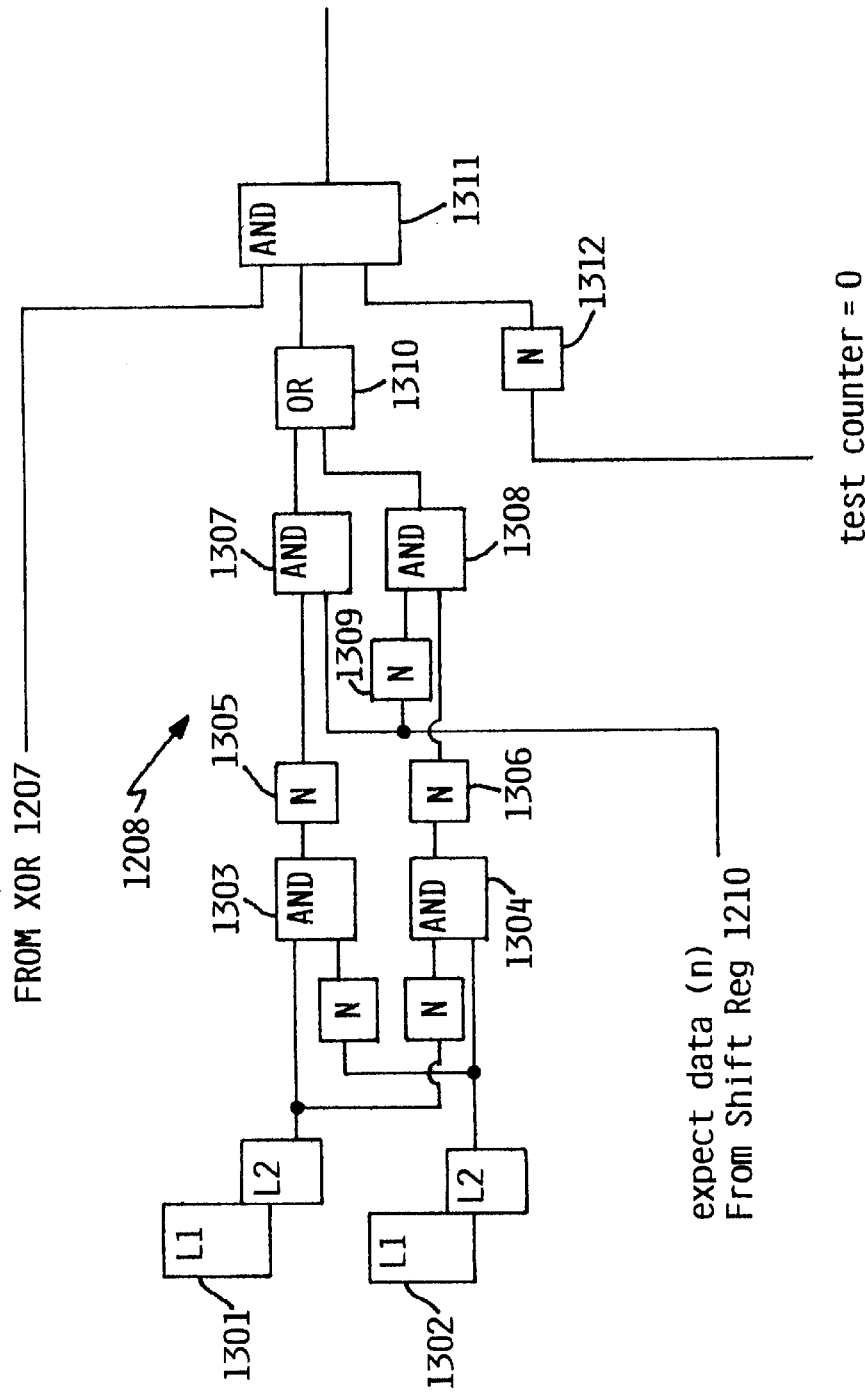
FIG. 13 is a circuit diagram showing in greater detail the major elements of mask logic in a receiver circuit for controlling test parameters, according to the preferred embodiment.

Mask logic 1208 provides the capability to selectively mask errors in the transmission of logic "1" or of logic "0", and thereby identify the most frequently occurring type of error, and to run a test for a specific number of bus cycles. FIG. 13 illustrates the major elements of mask logic 1208 in greater detail. As shown in FIG. 13, a pair of latches 1301, 1302, are used as a 2-bit register to store a value indicative of the type of test data for which errors will be logged. These latches are appropriately set at the beginning of a test run, and do not change during the test. A value of 1 in latch 1301 and 0 in latch 1302 means that the output of AND gate 1303 is logic 1, the output of AND gate 1304 is logic 0, and therefore the output of inverter 1305 is logic 0, and the output of inverter 1306 is logic 1. The output of inverter 1305 being 0, the output of AND gate 1307 is also 0 regardless of the other input. The aforementioned values are static throughout a test run. If the expected data bit produced by pattern generator 1209 and held in the corresponding cell of shift register 1210 is logic 0, then the output of inverter 1309 is logic 1, and the output of AND gate 1308 and OR gate 1310 are accordingly logic 1. If the expected data bit from shift register 1210 is logic 1, then the output of inverter 1309 is logic 0, the output of AND gate 1308 is logic 0, and the output of OR gate 1310 is logic 0. Similar reasoning will show that if latch 1301 holds a logic 0 and 1302 holds a logic 1, OR gate 1310 will be logic 1 whenever the expected data is a logic 1, and will be logic 0 whenever the expected data is a logic 0. Finally, if both latches 1301, 1302 hold the same value, OR gate 1310 is always a logic 1. Thus, any errors detected by XOR gate 1207 will pass through AND gate 1311 if the expected data was of the type to be tested for, according to the settings of latches 1301, 1302.

Referring to FIG. 12, test counter 1211 is a counter register that is decremented with each clock cycle of the bus clock. The register is initialized to a test cycle count, and outputs a signal to the mask logic when the cycle limit is reached. This signal passes through inverter 1312 to AND gate 1311. Thus, once the test counter 1211 has reached the pre-determined cycle limit, the output of AND gate 1311 held at logic 0, regardless of the other inputs. One of the advantages of certain embodiments described herein is the ability to simulate operation of an inter-chip interface under realistic conditions over a large number of cycles, and thus to measure very low error rates. A typical interface specification may require an error rate on the order of $10^{-14}$, although not all test runs will be required to go that high. Accordingly, it is preferred that counter 1211 be able to count a large number of cycles, e.g., that counter 1211 contain 32 or more bits, with the capability to count to $2^{32}$ or more cycles, and more preferably, that the counter contain 48 bits, with the capability to count to $2^{48}$ cycles.

The output of mask logic 1208, i.e., the output of AND gate 1311, is input to the S input of S-R latch 1212. In practice, S-R latch 1212 is cleared at the beginning of a test run, and is set if any error is detected during the test run. The outputs for each S-R latch 1212 of each receiver logic element 402 are input to OR gate 1213, which in turn provides input to global fail latch 1214. Global fail latch 1214 provides an indication whether any error has been detected in any line during the test run. If an error has been detected, then each latch 1212 for each individual line 406 can be interrogated to determine the line or lines which experienced errors.

The output of each mask logic 1208 of each receiver element 402 is further input to common select/OR logic 1215. Select/OR selects an arbitrary subset of input lines from the various mask logic units 1208, according to selection bits, and logically ORs the selected lines to produce a single composite output signal. This output signal will be logic 1 for a given bus cycle if any selected line experienced an error for that cycle, and will be logic 0 otherwise. Select/OR could be implemented in various ways, e.g., as a set of pass gates, one for each mask logic output line, in which each respective pass gate is controlled by a respective single latch, which is set with an appropriate value at the beginning of the test, the pass gates being followed by a conventional OR gate. The output signal of select/OR logic 1215 is input to error counter 1216, which counts the total number of bus cycles in which an error in a selected line was detected. This is not necessarily the same as the number of errors, since more than one error could occur in a single cycle.

Select/OR logic 1215 and counter 1216 support the simultaneous testing of all lines and counting of all errors detected, or the counting of errors only on isolated groups of lines, or on a single line. The ability to count errors on a single line or groups of lines may be significant where an isolated line or group of lines is determined to be a problem, and it is desirable to observe the effect of varying certain line parameters on the error rate in that line or group of lines in order to more fully understand the nature of the problem.

In accordance with the preferred embodiment of the present invention, an inter-chip interface can be tuned in any of several ways. The threshold voltage of the receiver can be adjusted within a predetermined range. The phase of the received data bit relative to the bus clock can be adjusted (either by adjusting a delay of the received data bit, adjusting a delay of the bus clock, or both. Finally, the power/impedance characteristics of the driver can be adjusted.

FIGS. 14A–14D illustrate various implementations of a variable reference differential receiver 1201, which support a variable level of reference voltage $V_{REF}$ against which an incoming signal voltage is compared to determine whether the signal is to be interpreted as a logic 0 or a logic 1. Conventionally, a reference voltage $V_{REF}$ is supplied to module 300 via an external pin, and this common reference voltage is used for one of the inputs to each respective differential receiver circuit of each data line of a bus. In the various preferred embodiments described herein, a conventional differential receiver is used, but $V_{REF}$ is provided in a form which can be varied. The various implementations described herein are equally applicable to differential receiver 1201 which receives a data signal and differential receiver 1205 which receives the clock signal.

Figure 14A:
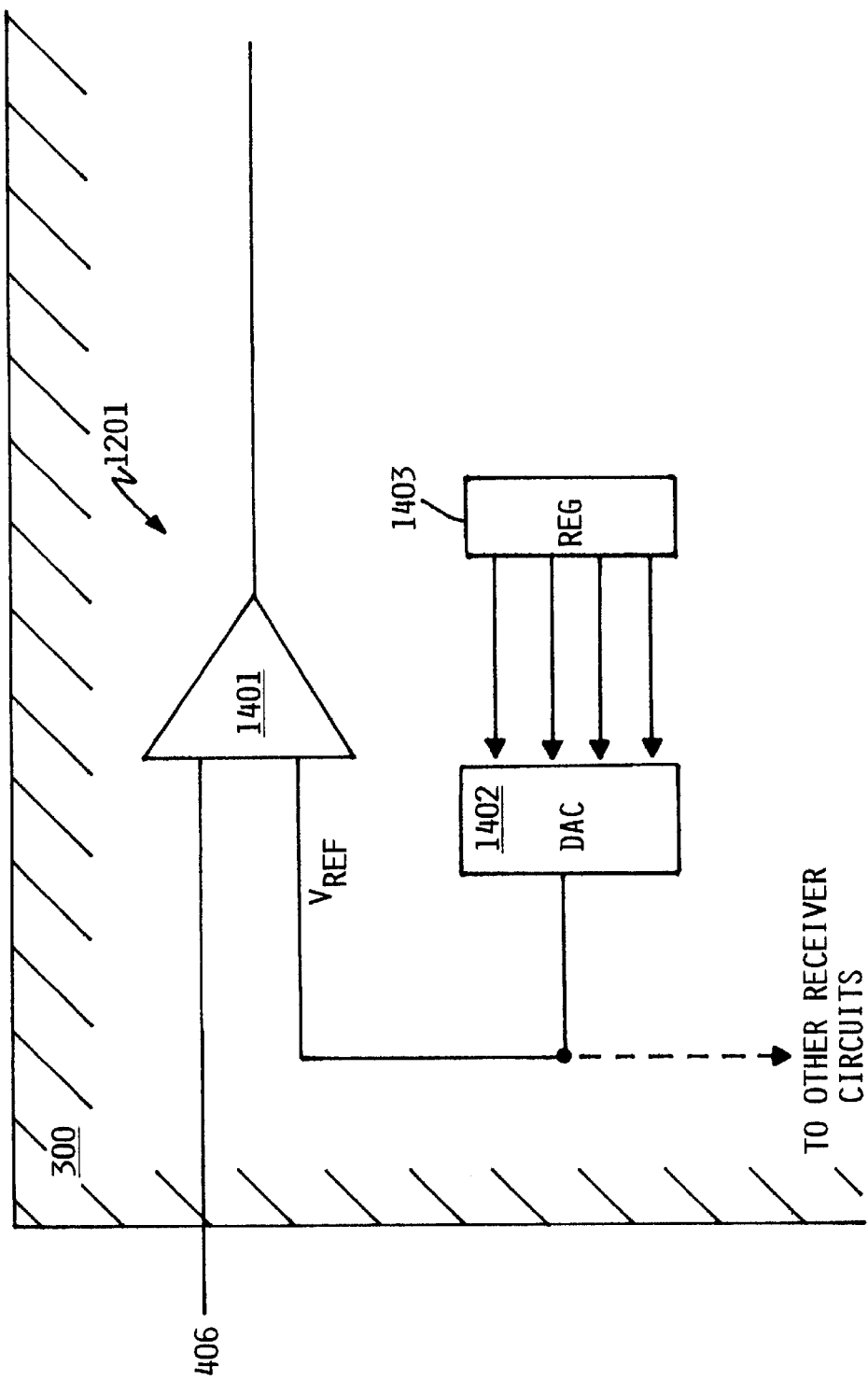
FIGS. 14A–14D illustrate various implementations of variable reference differential receiver circuit, according to the preferred embodiment.

In accordance with a first preferred embodiment, illustrated in FIG. 14A, a reference voltage is internally produced within module 300 by a simple digital-to-analog converter (DAC) 1402, and supplied to one input of a differential receiver driver 1401, the other input receiving data bit line 406. Because it is typically necessary to provide only a voltage adjustment within a small range, the number of discrete $V_{REF}$ levels required is not large, and the DAC may be implemented with a small number of digital input lines (e.g., 4 lines, providing 16 different $V_{REF}$ levels, or possibly fewer, may be sufficient). The digital input to DAC 1402 may be stored in a small register 1403. DAC 1402 may supply $V_{REF}$ for only one line 406 (meaning that a separate DAC 1402 is required for each differential receiver circuit 1201), or may supply $V_{REF}$ for multiple lines, e.g., all the lines in a common bus connection.

Figure 14B:
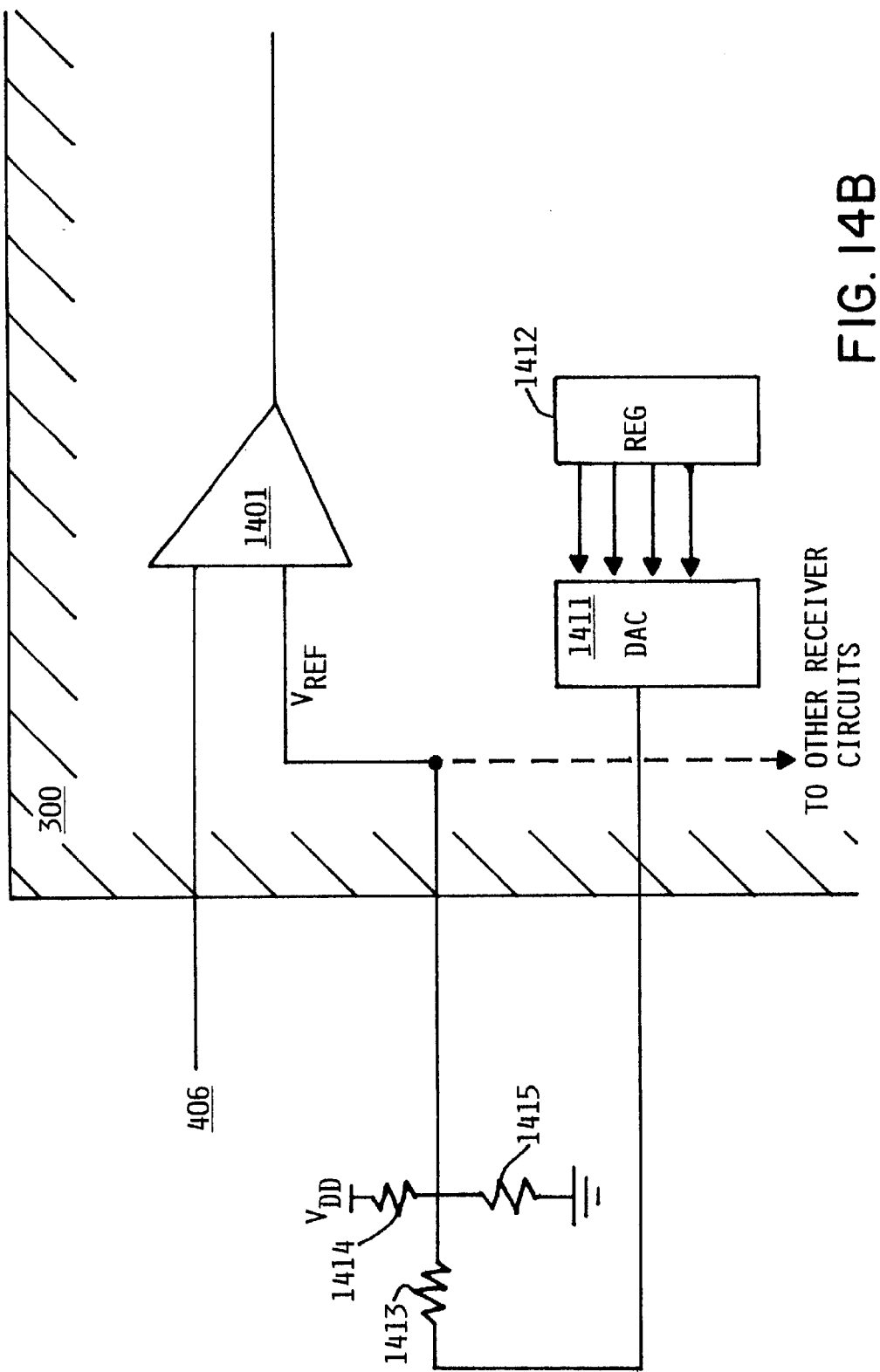

FIG. 14B illustrates a second preferred embodiment of a variable voltage differential receiver 1201. In this embodiment, $V_{REF}$ is produced by an external voltage divider circuit comprising series resistors 1414 and 1415, connected between $V_{DD}$ and ground. Generally, it is desirable to produce a reference voltage of approximately $V_{DD}/2$, and so the resistance of resistors 1414 and 1415 is approximately equal. Fine tuning of $V_{REF}$ is accomplished by a third resistor 1413, coupled between $V_{REF}$ and the output of digital-to-analog converter 1411. The resistance of resistor 1413 is typically significantly higher than the resistance of either resistor 1414 or 1415. Like DAC 1402, DAC 1411 may be implemented with a small number of digital input lines from a small register 1412. The voltage range of DAC 1411 is typically higher that the voltage range of DAC 1402 e.g., DAC 1411 may range from ground to $V_{DD}$, the range of $V_{REF}$ being then determined by the relative values of resistors 1413, 1414 and 1415. Although it would be theoretically possible to provide a separate $V_{REF}$ circuit such as shown in FIG. 14B for each input line 406, this is considered impractical because two external pins are required for each $V_{REF}$ circuit. Therefore it is expected that the implementation of FIG. 14B will be used only where a single voltage reference circuit will supply a common $V_{REF}$ for a group of input lines, such as, e.g., all the input lines of a common data bus.

Figure 14C:
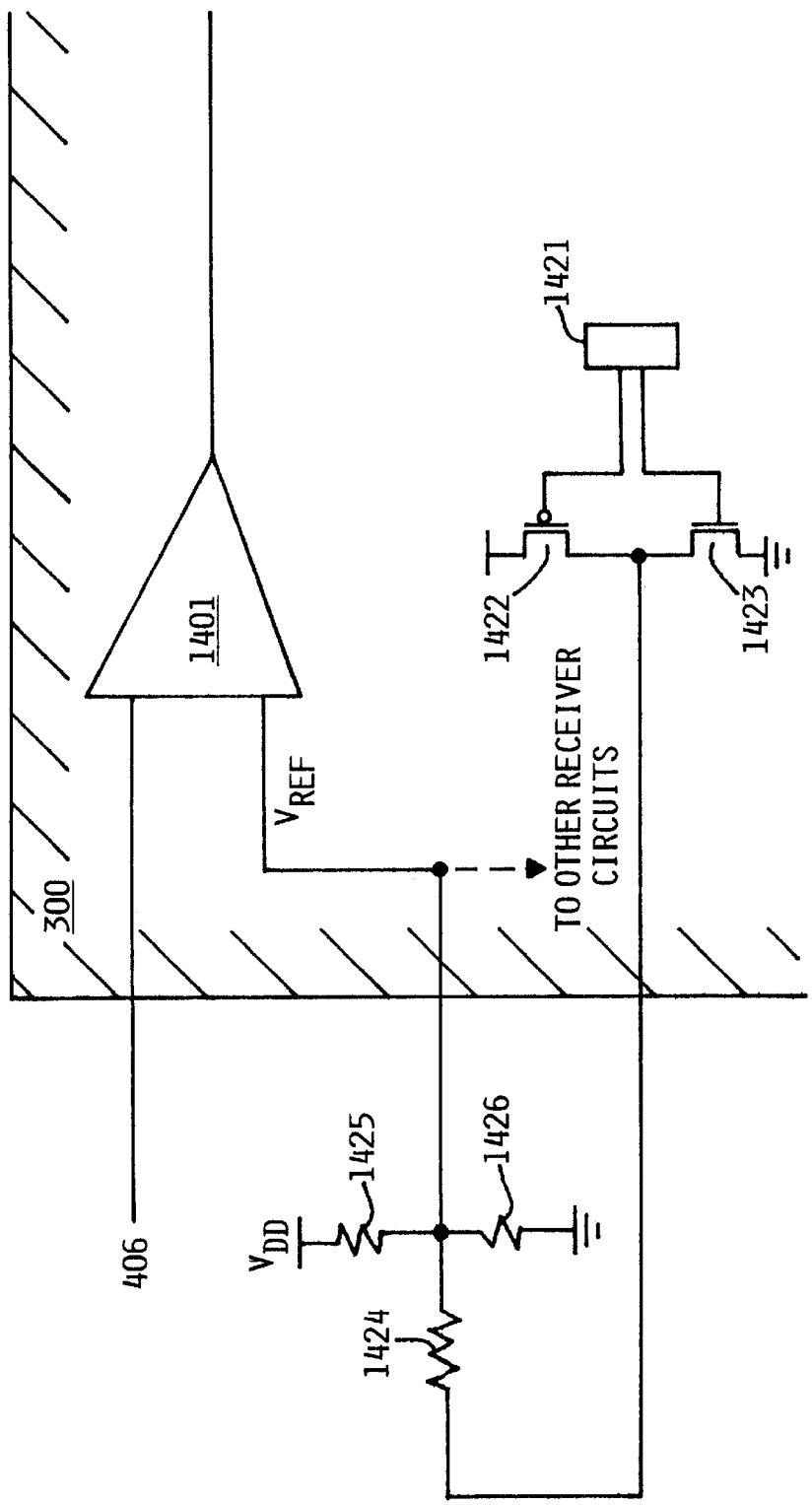

FIG. 14C illustrates a third preferred embodiment of a variable voltage differential receiver 1201. This embodiment is similar to the embodiment of FIG. 14B, in that $V_{REF}$ is produced by an external voltage divider circuit comprising roughly equal series resistors 1425 and 1426, connected between $V_{DD}$ and ground. $V_{REF}$ is fine-tuned by resistor 1424 having a resistance significantly higher than the resistances of either resistor 1425 or 1426, and which can selectively be coupled to $V_{DD}$ by turning on PFET 1422, or to ground by turning on NFET 1423, or to a high impedance state by shutting off both PFET 1422 and NFET 1423. PFET 1422 and NFET 1423 are controlled by values stored in two-bit register 1421. The implementation of FIG. 14C thus provides three possible values of $V_{REF}$, a nominal value, a step high (by turning on PFET 1422), and a step low (by turning on NFET 1423). Because two external pins are required for the $V_{REF}$ circuit of FIG. 14C, it is expected that this implementation will not be replicated for each input line

406, and will be used only where a single voltage reference circuit will supply a common $V_{REF}$ for a group of input lines, such as, e.g., all the input lines of a common data bus.

Figure 14D:
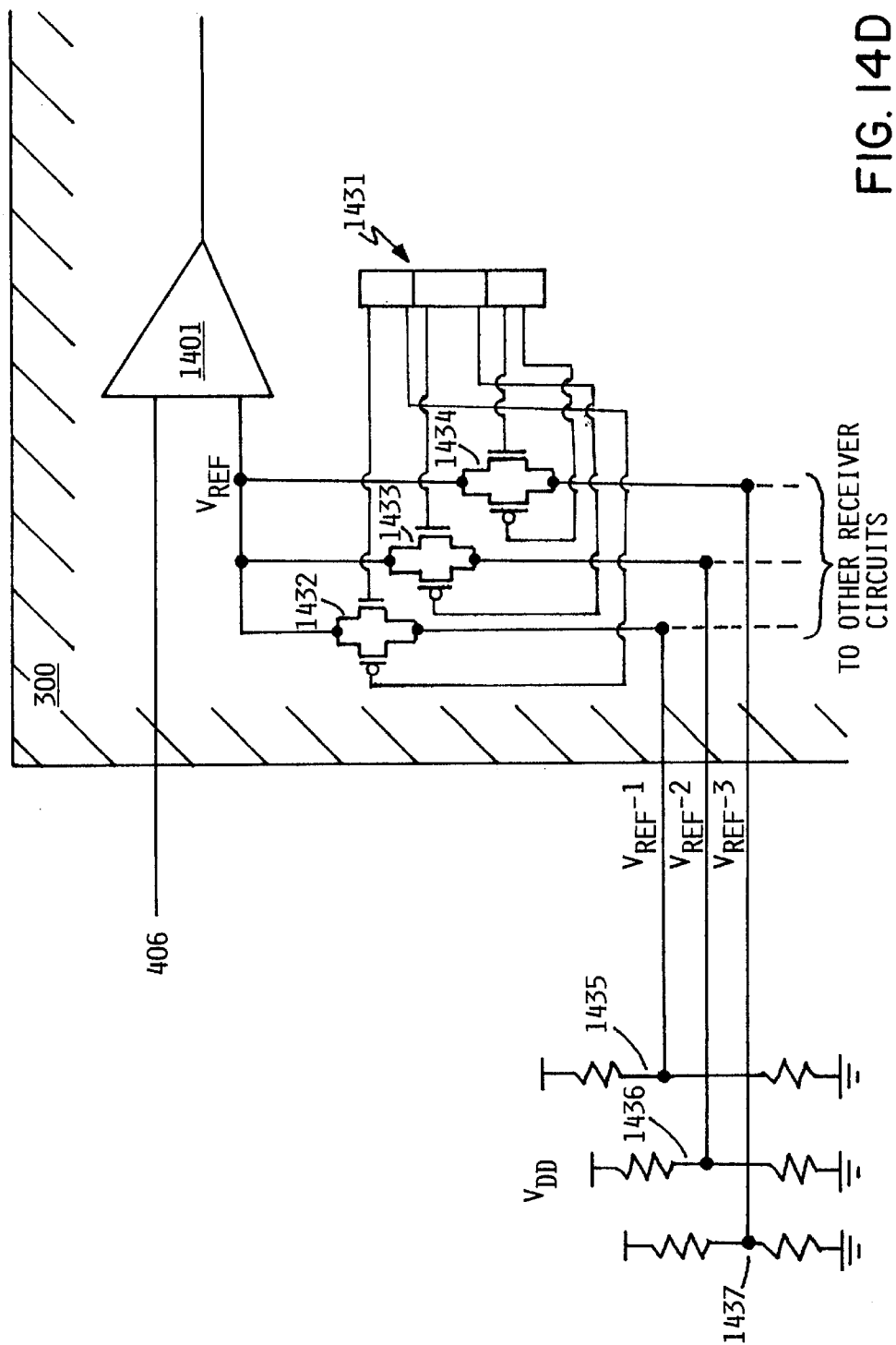

FIG. 14D illustrates a fourth preferred embodiment of a variable voltage differential receiver 1201. In this embodiment, a 3-bit register 1431 having bit complemented and uncomplemented outputs is used to select one of three transmission gates 1432–1434, each transmission gate comprising a PFET and an NFET. The transmission gates select one of three external voltage reference inputs $V_{REF}1$, $V_{REF}2$, $V_{REF}3$ for input to differential receiver 1401. If the three reference voltages $V_{REF}1$, $V_{REF}2$, $V_{REF}3$ are sufficiently far from logic "1" or logic "0", it may alternatively be possible to use pass gates comprising only a single NFET or PFET instead of the transmission gates having a pair of transistors, as shown. The three voltage references can be generated using any conventional method. E.g., three separate voltage divider circuits 1435–1437 may be used, each having different resistor values (as shown), or a single voltage divider with three taps could be used, or a variable voltage divider such as illustrated in FIGS. 14B and 14C could be used. The implementation of FIG. 14D has the potential advantage of providing a different reference voltage for each line 406, because voltage dividers 1435–1437 and external pins may be common to all the lines, and only the selection logic, comprising register 1431 and transmission gates 1432–1434, must be replicated for each line.

The various implementations of FIGS. 14A–14D are merely four examples of possible circuits which provide a variable reference voltage, and it will be appreciated that any of various alternative circuits could be used instead of those shown. In particular, while FIGS. 14B–14D show various circuit components external to module 300, it would alternatively be possible to place all voltage reference components within module 300. Placing components within module 300 would reduce the number of external pins required, and may make it practical to provide different reference voltages for individual lines using the arrangements of FIGS. 14B and 14C.

Figure 15A:
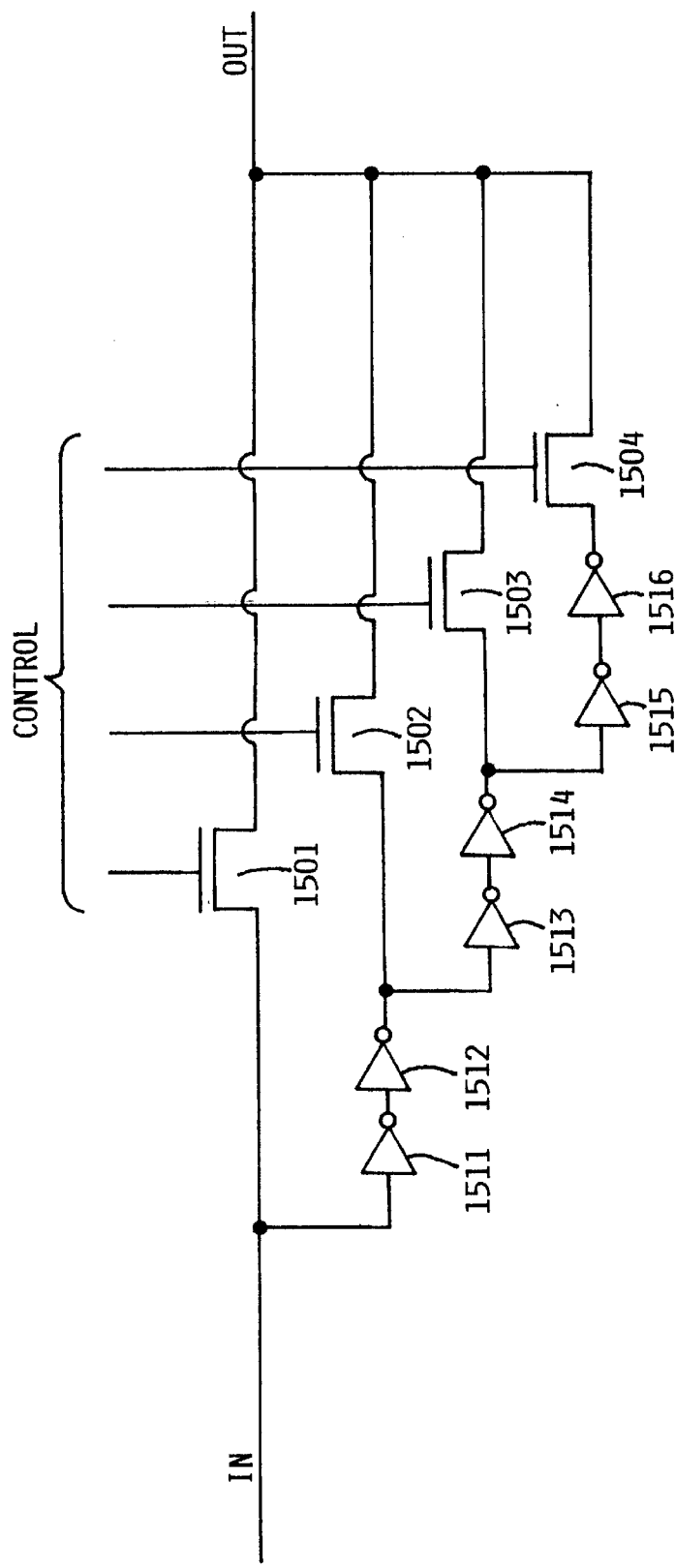
FIGS. 15A and 15B illustrate simple implementations of a delay circuit, according to the preferred embodiment.

Delay circuits 1202 and 1206 can be implemented in any of a variety of ways. A very simple implementation of a delay circuit is shown in FIG. 15A. As shown in FIG. 15A, the delay circuit comprises multiple pass transistors 1501–1504 which are gated by delay circuit control bits. Each pass transistor controls one of a plurality of paths through the delay circuit. A minimal delay path passes through only pass transistor 1501. A first delay path passes through inverters 1511, 1512, and pass transistor 1502. A second delay path passes through inverters 1511–1514, and pass transistor 1503, and a third delay path passes through inverters 1511–1516 and pass transistor 1504. Although four paths are shown, the number of paths may be greater or may be less, e.g. delay elements may be increased by adding additional paths and pass transistors to provide an arbitrary multiple of inverter pair delays.

Figure 15B:
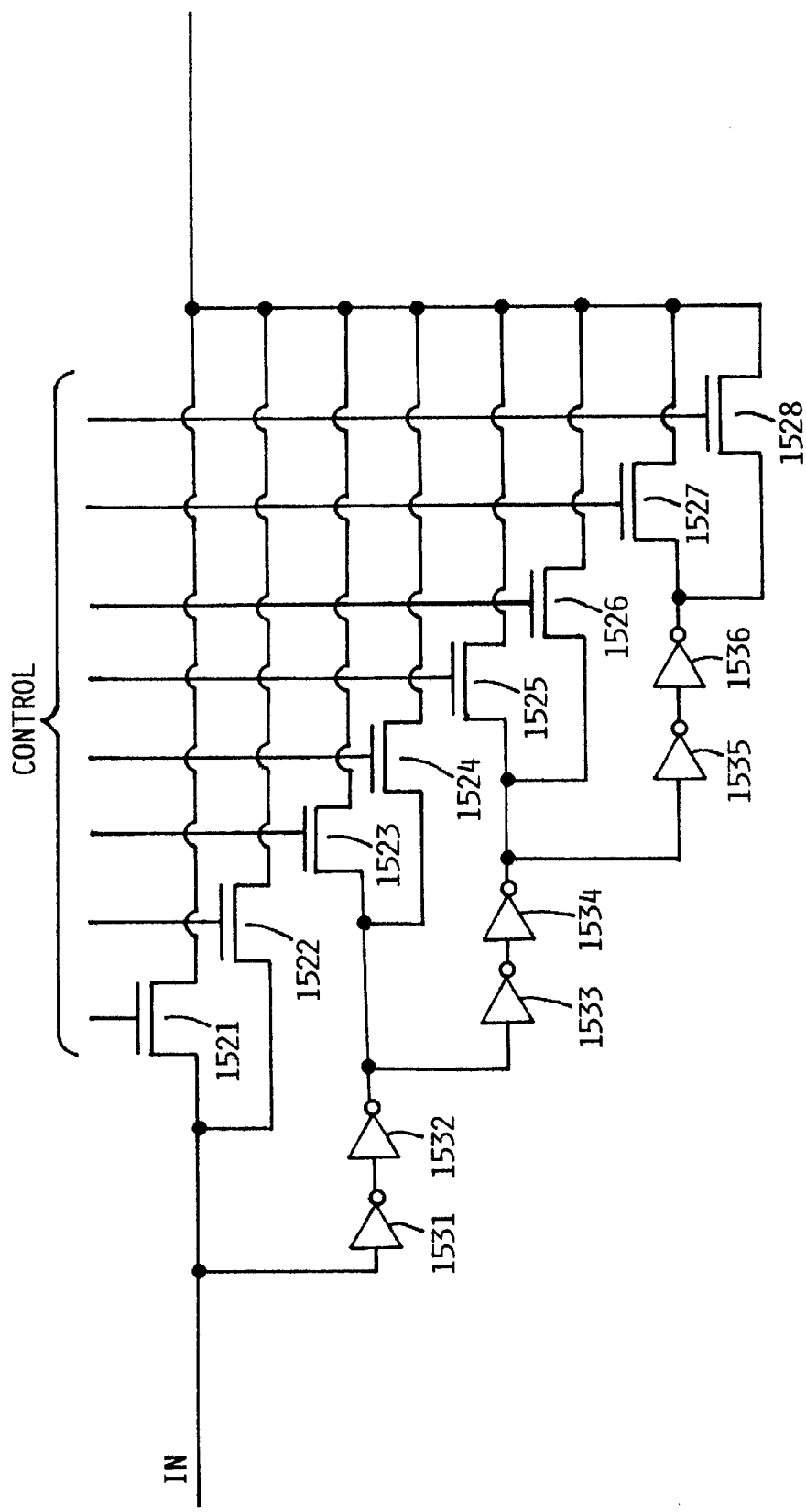

Although the simple circuit of FIG. 15A provides coarse delay increments of two inverter drivers, it is preferred that the delay circuits have a finer delay resolution. This may be implemented by employing alternative signal transmission paths, wherein the size of drive transistors or pass transistors (and hence the switching times of the drive transistors, or propagation times of the pass transistors) are different, thus achieving delay differences which are less than an inverter pair delay. FIG. 15B shows a simple modification to the circuit of FIG. 15A which accomplished finer resolution by use of different sized pass transistors. Additional more sophisticated implementations of delay circuits having fine resolution are disclosed in U.S. patent application Ser. No. 09/263,671, filed Mar. 5, 1999, entitled "Programmable Delay Element", which is herein incorporated by reference.

As shown in FIG. 15B, the delay circuit comprises multiple pass transistors 1521–1527 which are gated by delay circuit control bits, each pass transistor controlling a respective delay path. Pass transistors 1522, 1524, 1526 and 1528 are physically smaller and have longer transmission times than pass transistors 1521, 1523, 5125 and 1527. A minimal delay path passes through pass transistor 1521, while the delay path through pass transistor 1522 is longer due to the physical size of transistor 1522. As with the circuit of 15A, a two-inverter delay path passes through inverters 1531, 1532, and pass transistor 1523. Using the same inverters and pass transistor 1524, the delay is approximately equivalent to three inverters. Similarly, a four-inverter delay path passes through inverters 1531–1534, and pass transistor 1525, a five-inverter path through pass transistor 1526, a six-inverter path through pass transistor 1527, and a seven-inverter path through transistor 1528.

Figure 16:
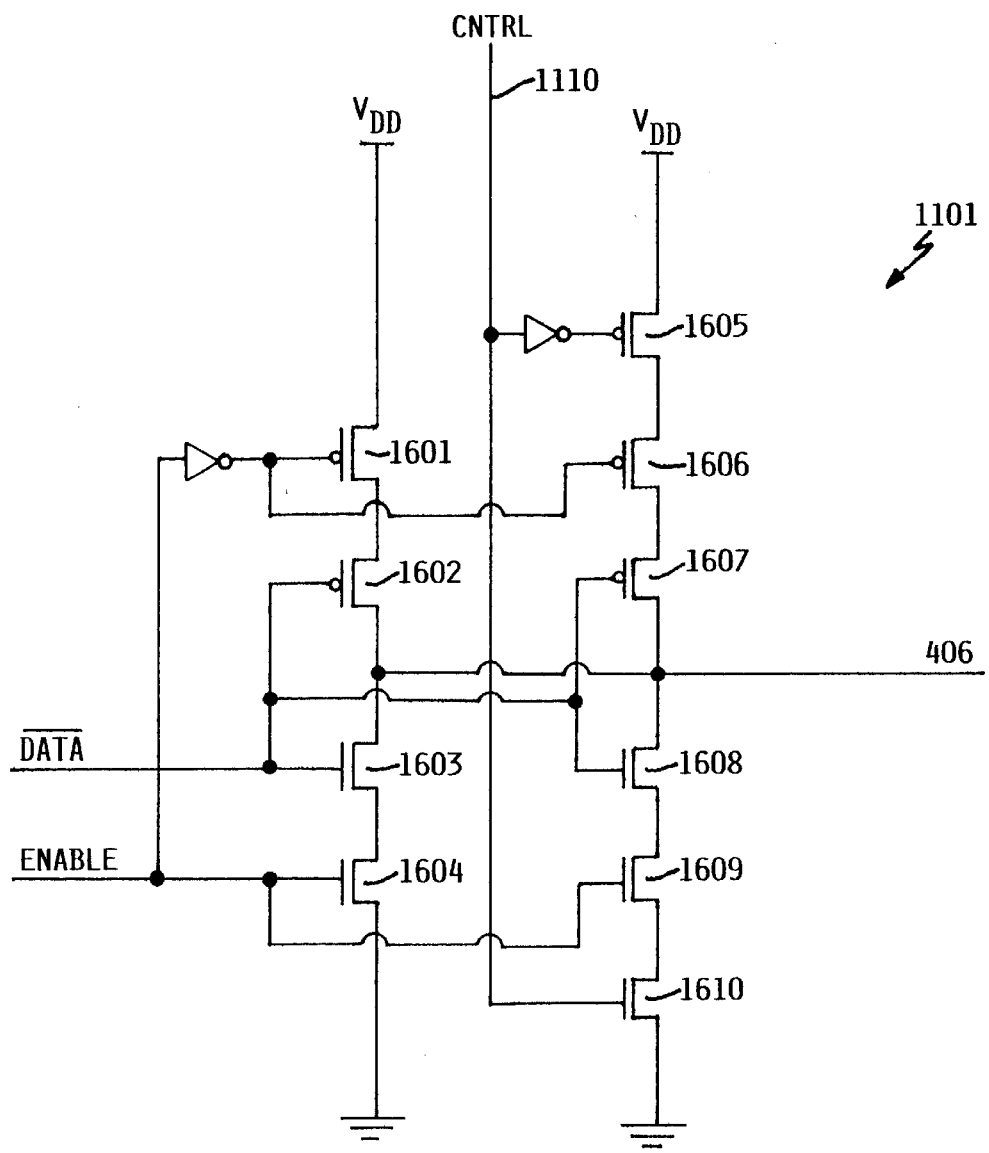
FIG. 16 illustrates a simple implementation of a variable power driver circuit, according to the preferred embodiment.

In the preferred embodiment, delay circuits 1202 and 1206 provide the same level of delay resolution, making it possible to delay either the clock or the data signal as necessary. It may be necessary to provide additional drivers (not shown) on the output of clock delay circuit 1206 to handle the fan-out of the common clock signal to a large number of data input lines. Additionally, circuits 1202 and 1206 need not provide the same resolution. For example, it may be possible to provide a relatively coarse delay clock circuit 1206, and a relatively finer delay data line delay circuit 1202. Additionally, it would be theoretically possible to omit the clock delay circuit 1206 altogether, if the various data line delay circuits can delay the input signals for an entire clock cycle. I.e., a data signal can be synchronized to any unadjusted clock signal by sufficiently delaying the data signal. However, this latter approach may cause unnecessary delay in the propagation of the received input signals Referring to FIG. 11, there are multiple ways to implement variable driver circuits 1101 to provide tunable characteristics at the transmitting module. In general, multiple drive transistors are connected in parallel, where at least one set of drive transistors is selectively enabled or disabled by driver variation control signal 1110. A very simple implementation of a driver circuit 1101 is shown in FIG. 16. As shown in FIG. 16, the driver circuit is an inverter driver comprising two parallel CMOS drivers. The primary driver comprises PFETs 1601, 1602 and NFETs 1603, 1604. A secondary driver comprises PFETS 1605–1607 and NFETs 1608–1610. The physical size of the transistors in the primary and secondary drivers is not necessarily the same. PFETs 1602, 1607 and NFETs 1603, 1608 are activated by the data signal. PFETs 1601, 1606 and NFETs 1604, 1609 disable the driver if the enable signal from AND/OR logic 1109 is low, placing drive circuit 1101 in a high impedance state. PFET 1605 and NFET 1610 selectively enable or disable the secondary driver depending on the state of driver variation control signal 1110. Thus, in the circuit of FIG. 16, if 1-bit control signal 1110 is high, the secondary driver is enabled, and greater power is provided to drive the output line.

In will be understood that additional driver variation could be provided, specifically, that multiple control lines could be provided, that multiple secondary drivers could be provided, and that other forms of driver variation could be controlled. As one example of such additional driver control, a driver circuit in accordance with the present invention could have any or all of the characteristics of circuits disclosed in U.S. Pat. No. 4,939,389 to Cox et al., which is herein incorporated by reference.

In the preferred embodiment, clock drive circuit 403 also contains a variable driver capability (not shown) similar to that of driver circuit 1101.

It should be understood that driver circuit 401 and receiver circuit 402 are shown and described herein in simplified form for clarity of illustration and explanation, and that an actual implementation of such circuits may contain additional functions not necessary for an understanding of the present invention. For example, such interface circuits typically include some form of boundary scan logic, such as boundary scan logic conforming to IEEE Standard 1149.1, entitled "IEEE Standard Test Access Port and Boundary Scan Architecture".

In operation, the inter-chip interface described herein supports the characterization of an interface and the tuning of the interface to an optimal set of tuning parameters. In general, it is anticipated that detailed characterization of an interface will be performed during a development stage of a computer system, at which time developers can devote significant resources to finding optimal interface tuning values. However, characterization at some level could further be performed during a manufacturing stage on each individual circuit card assembly or computer system, either as a form of verification that the system meets some minimum performance parameters, or as a quick determination of an optimal tuning value from among a small set of values, e.g., an optimal delay value. Alternatively, characterization or tuning could even be performed as part of system initialization in upon installation in the user's location.

Figure 17:
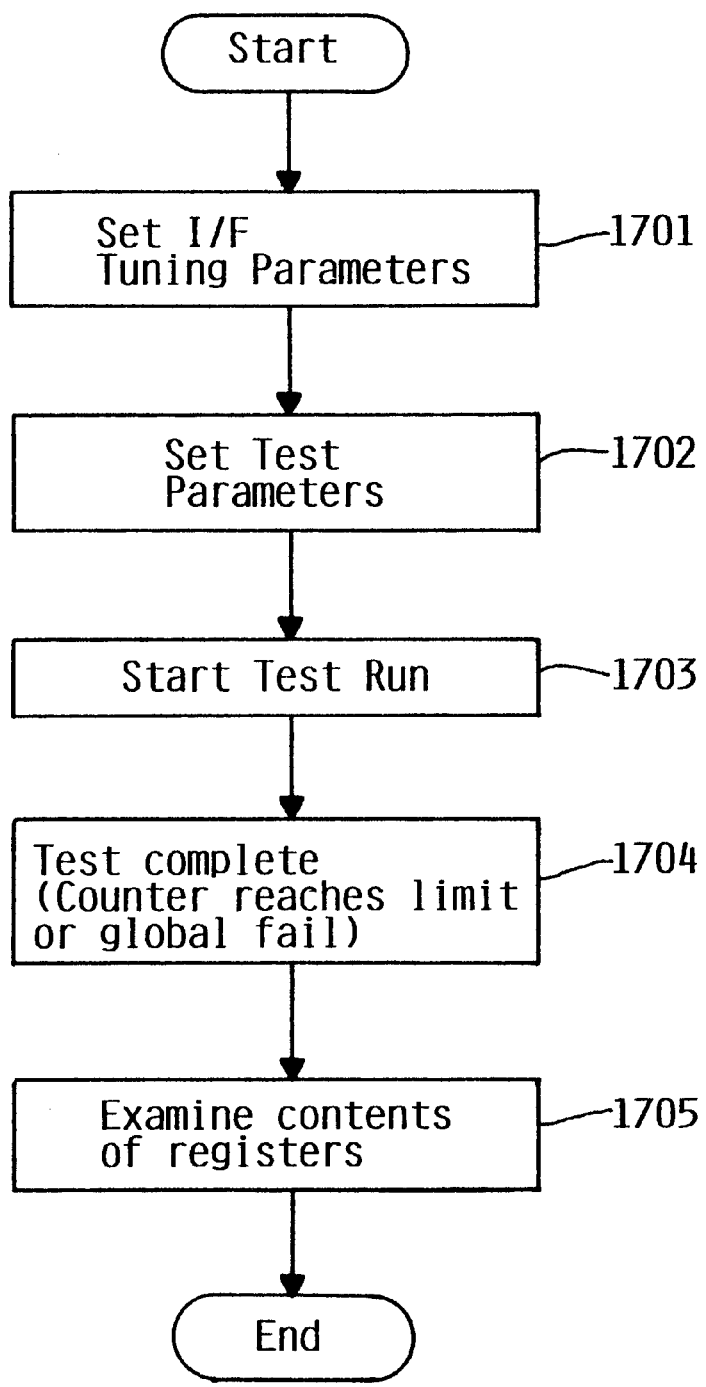
FIG. 17 is a high-level flow diagram illustrating the main steps of a test run, according to the preferred embodiment.

For all types of characterization, the basic unit of information gathering is a test run. FIG. 17 is a high-level flow diagram illustrating the main steps of a test run, according to the preferred embodiment. As shown in FIG. 17, the integrated circuit modules of the interface to be examined are first initialized to the state of the tuning parameters to be used for the test (step 1701). Specifically, the enable mask bits for the drivers 1101 in each applicable module are initialized, so that only the drivers in the transmitting module are enabled, and of these drivers, only the drivers to be tested are enabled. Any driver variation control bits 1110 in the transmitting module are set to the desired test parameters. The clock drivers 403 are similarly initialized. In the receiving module, the control lines for $V_{REF}$ variation in receivers 1201, 1205 are set to desired values, and the control lines for delay variation in delay circuits 1202, 1206 are similarly set.

The parameters of the test are set in the modules (step 1702). Specifically, pseudo-random pattern generators 1107 and 1209 and shift registers 1108, 1210 are initialized with common values. The mask bits 1301, 1302 in mask logic 1208 are set to desired values. Select logic 1215 is set to select the line or lines to be tested. Test cycle counter 1211 is set to the desired number of test cycles. Test mode line 1104 in the transmitting module is set. Additionally, certain elements, such as bit fail latch 1212, global fail latch 1214, and error counter 1216, are cleared or zeroed.

The test is then commenced with an appropriate test start or reset signal (not shown) (step 1703). When counter 1211 reaches the pre-designated limit, mask logic 1208 is turned off so that further events are not recorded. Additionally, the limit signal from counter 1211 triggers an external indication (not shown) that the test is complete (step 1704), or software may wait a pre-determined time and then check for test completion. In the preferred embodiment, global fail latch will also provide an external indication of at least one error, so that the tester can abort the test early if desired.

The tester can then disable the clock and examine the contents of error counter 1216, global fail latch 1214 or bit fail latch 1212 (step 1705).

The basic test procedure of FIG. 17 can be used with many variations to obtain detailed information about the interface. As one example, although by no means the only such example, it is possible to use this procedure to construct error rate "bathtub" curves which plot error rate as a function of an offset $t_{REF}$ from the clock signal. This is accomplished by conducting a series of test runs, in which the delay values of delay circuits 1202 and/or 1206 are varied with each test run, which other interface tuning parameters (i.e., $V_{REF}$ and driver power) are held constant, preferably at some nominal value. The errors accumulated during each respective test run are then plotted against the delay offset to which the delay circuits 1202, 1206 were set to produce a bathtub curve. By using the select/OR logic 1215, it is possible to test a single line at a time, and thus to obtain an accurate bathtub plot of each individual line of an interface, i.e., to produce data similar to that represented in FIG. 10.

Figure 18:
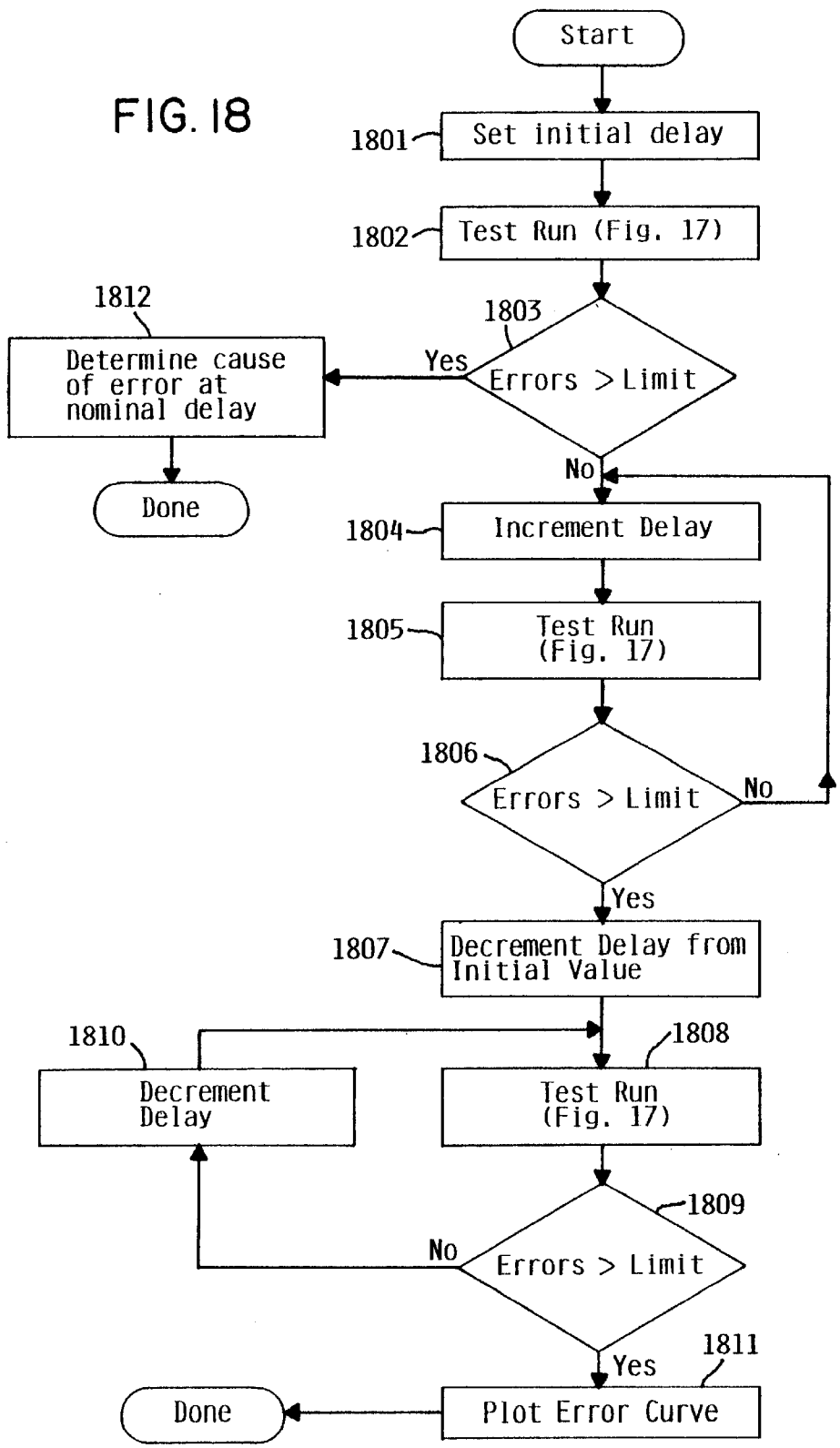
FIG. 18 is a high-level flow diagram illustrating a process for obtaining an error rate "bathtub" curve, according to the preferred embodiment.

A process for plotting a single bathtub curve is shown in FIG. 18. As shown in FIG. 18, an initial delay value is established (such as a nominal delay value) (step 1801), and a test run over a large number of cycles conducted at this value (step 1802). If the error rate is below some predetermined limit (step 1803), the delay value is then incremented (step 1804), and the test run repeated (step 1805), until the error rate is greater than some high limit (e.g., close to 0.5), at which point further delays will only make the error rate worse, and the "Y" branch from block 1806 is taken. The delay is then set to the initial delay value, decremented by one unit (step 1807), and the test run repeated (step 1808). If the error rate is less than the limit (step 1809), the delay is decremented (step 1810), and the test run repeated. When the error rate reaches the limit, the data collection ends because sufficient data points have been obtained. The curve is then plotted using the error data collected from the various test runs (step 1811). If, at step 1803, the errors are already above the limit, there may be something wrong with the logic, or the nominal delay value may give erroneous data when some other delay value will provide acceptable results. In this case, experimenting with different parameters of $V_{REF}$, driver power and/or delay may produce an acceptable error rate or otherwise lead to some understanding of the cause of the error, (step 1812).

The process illustrated in FIG. 18 is simply one illustration of a process for obtaining error rate data, and can be varied in many particulars. For example, the starting point of delay could be some high delay value or some low delay value; the incremental delay might initially be high (in the vicinity of the bathtub trough), and could be made finer as the error rate starts to increase near the edges of the "bathtub"; it might be possible to test multiple lines simultaneously in the trough (where error rates are very low), and separate individual lines only near the edges of the trough; etc. Furthermore, it will be understood that a similar process could be used to obtain error rate bathtub curves showing the change in error rate as a function of some other parameter, such as $V_{REF}$ or driver power. However, it is more typical to obtain such data as a function of different delay values in the receiver.

Figure 19:
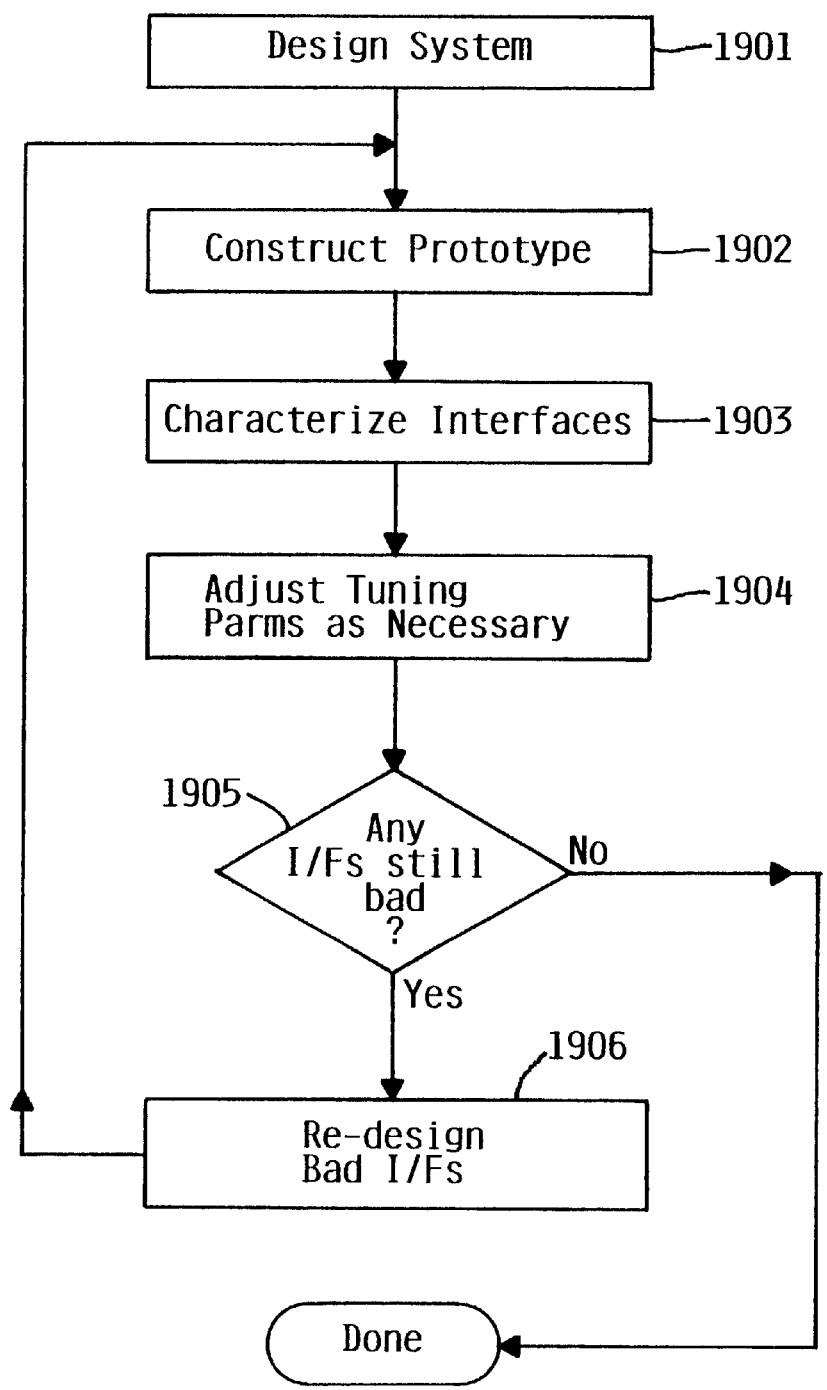
FIG. 19 is a high-level flow diagram illustrating an overall process for fine tuning an interface design, according to the preferred embodiment.

FIG. 19 illustrates an overall system development process as envisioned herein. In general, a system may be developed in conjunction with the present invention by first designing the various modules and interface connections using any of various conventional design tools (step 1901). Conventional methods are typically sufficient to construct inter-chip interfaces which, under some or most conditions, correctly transmit data. A physical prototype system is then constructed, in which the interfaces are characterizable and tunable as described herein (step 1902). Any of the various techniques described herein may then be used to characterize the interfaces (step 1903). In the case of some interfaces, the prototype may be sufficiently accurate that no adjustment of the interface is necessary. In the case of other interfaces, it may be only necessary to adjust some tuning parameter or parameters as described herein with respect to one or more lines in order to achieve acceptably low error rates (step 1904). If all interfaces now function within specification (the "N" branch from step 1905), the interface design is finished and verified. During production, the interfaces in each manufactured card assembly will be set to the tuning parameters verified during the design phase. In some cases, it is possible no amount of tuning parameter adjustment can bring a line or lines below a specified error rate. In these rare cases, it may be necessary to alter circuit paths on a circuit card, to add, remove or alter discrete components, etc. (step 1906). However, even in these rare cases, the knowledge gained from a thorough analysis and characterization of the interfaces is invaluable to the designers. As an alternative to re-design (step 1906), it may be possible to individually tune marginal interfaces during manufacture or upon installation. I.e., it may be that, for a particular interface, it is impossible to find a set of tuning parameters which will produce acceptable performance under all or a sufficiently large percentage of manufacturing tolerance conditions, but that by tuning individual assemblies to take into account these individual variations, performed either at manufacturing time or upon installation in the user's environment, this fault can be overcome.

Tuning performed during manufacture or installation in the user's environment would follow essentially the same procedure described above with respect to FIGS. 17–19, but in general it would be expected that interface characterization performed during manufacture or installation would be less thorough than characterization performed during the design phase. It will be recalled that, during the design phase, it is desirable to find nominal values of $V_{REF}$, $t_{REF}$, and other parameters that will provide maximum tolerance for individual variations occurring during manufacture and in user environments. At least some of this variation is already accounted for in the manufacturing or user environment. It may be that only one parameter is tuned in the manufacturing or user installation environment, and/or that groups of lines rather than individual lines are tuned. The procedure could involve finding the edges of a bathtub curve to establish an acceptable range for each parameter, determining whether the "eye" is open enough (ranges of parameters are large enough), and selecting parameter values near the center of the range.

In the preferred embodiment, the interface has the capability to alter the timing of individual signal lines, the reference voltage of individual signal lines, and the driver power of individual signal lines. However, in any of various alternatives, some or all of these capabilities may be lacking, or additional capabilities may be present. For example, as explained above, it may be possible to alter reference voltage for a set of lines only (such as the lines of a single bus), rather than on an individual line basis, or it may be that reference voltage is not adjustable. Similarly, it may be possible to alter driver characteristics only for a set of drivers, such as the drivers of a common bus, or not to alter driver characteristics at all.

In the preferred embodiment, a clock line running parallel to the data line or lines transmits a clock signal for interface timing. However, a common clock signal could theoretically be obtained from some other source. E.g., the interface might be clocked at each module by a signal derived from reference clock 405.

In the preferred embodiment, a common reference clock 405 is used by both the transmitting and receiving modules. However, such a clock is not strictly necessary. It would alternatively be possible for each module to run asynchronously. For example, a clock signal generated internally by a transmitting module may be used to transmit and receive data, the data being receiving into a buffer in the receiving module. Functional logic within the receiving module may then access the data from the buffer asynchronously, using an internal clock within the receiving module.

Although a specific embodiment of the invention has been disclosed along with certain alternatives, it will be recognized by those skilled in the art that additional variations in form and detail may be made within the scope of the following claims.

What is claimed is:

1. A digital data processing system, comprising:
   at least one circuit card assembly for mounting electronic components and providing electrical connections to said components;
   a first and a second integrated circuit module mounted to said at least one circuit card assembly;
   at least one clocked intermodule communication line connecting said first and second integrated circuit modules;
   a first test pattern generator in said first module for generating a deterministic pseudo-random pattern;
   a second test pattern generator in said second module for generating a deterministic pseudo random pattern, said patterns generated by said first and second generators being identical;
   comparison logic in said second module which compares a deterministic pseudo-random pattern generated by said first test pattern generator and transmitted from said first module to said second module across said at least one clocked intermodule communication line with a deterministic pseudo random pattern generated by said second test pattern generator; and
   logging logic in said second module which records the occurrence of any miscompares in said comparison logic.

2. The digital data processing system of claim 1, wherein at least one of said first module and said second module comprises a programmable central processing unit of a computer system.

3. The digital data processing system of claim 1, further comprising a test cycle counter in said second module which records a number of test cycles.

4. The digital data processing system of claim 1, wherein said digital data processing system comprises a plurality of clocked intermodule communication lines connecting said first and second modules, and wherein said logging logic comprises selection logic for selectively recording the occurrence of miscompares in arbitrary subsets of said plurality of clocked intermodule communications lines.

5. The digital data processing system of claim 1, wherein said comparison logic further comprises mask logic which selectively masks miscompares at a specified logic level.

6. The digital data processing system of claim 1, further comprising:
   at least one line tuning circuit which selectively alters at least one characteristic of signals received on said at least one clocked intermodule communication line.

7. The digital data processing system of claim 6, wherein said digital data processing system comprises a plurality of clocked intermodule communication lines connecting said first and second modules, and wherein said at least one tuning circuit independently alters, for each respective clocked intermodule communication line, at least one characteristic of signals received on said respective clocked intermodule communication line.

8. The digital data processing system of claim 6, wherein said at least one line tuning circuit comprises a variable delay circuit in said second module.

9. The digital data processing system of claim 6, wherein said at least one line tuning circuit comprises a variable reference voltage circuit in said second module.

10. The digital data processing system of claim 6, wherein said at least one line tuning circuit comprises a variable power driver circuit in said first module.

11. The digital data processing system of claim 6, further comprising:
   at least one clock tuning circuit which selectively alters at least one characteristic of a clock signal line for said at least one clocked intermodule communication line, said clock tuning circuit altering said at least one characteristic of a clock signal line independently of said line tuning circuit.

12. The digital data processing system of claim 1, wherein said at least one clocked intermodule communication line comprises at least one clocked intermodule bi-directional communication line, said digital data processing system further comprising:
   comparison logic in said first module which compares a deterministic pseudo-random pattern generated by said second test pattern generator and transmitted from said second module to said first module across said at least one clocked intermodule bi-directional communication line with a deterministic pseudo-random pattern generated by said first test pattern generator; and
   logging logic in said first module which records the occurrence of any miscompares in said comparison logic.

13. A circuit card assembly for a digital data system, comprising:
   a first and a second integrated circuit module mounted to said circuit card;
   at least one clocked intermodule communication line connecting said first and second integrated circuit modules;
   a first test pattern generator in said first module for generating a deterministic pseudo-random pattern;
   a second test pattern generator in said second module for generating a deterministic pseudo random pattern, said patterns generated by said first and second generators being identical;
   comparison logic in said second module which compares a deterministic pseudo-random pattern generated by said first test pattern generator and transmitted from said first module to said second module across said at least one clocked intermodule communication line with a deterministic pseudo random pattern generated by said second test pattern generator; and
   logging logic in said second module which records the occurrence of any miscompares in said comparison logic.

14. The circuit card assembly of claim 13, further comprising a test cycle counter which records a number of test cycles.

15. The circuit card assembly of claim 13, wherein said circuit card assembly comprises a plurality of clocked intermodule communication lines, and wherein said logging logic comprises selection logic for selectively recording the occurrence of miscompares in arbitrary subsets of said plurality of clocked intermodule communications lines.

16. The circuit card assembly of claim 13, further comprising:
   at least one line tuning circuit which selectively alters at least one characteristic of signals received on said at least one clocked intermodule communication line.

17. The circuit card assembly of claim 16, wherein said circuit card assembly comprises a plurality of clocked intermodule communication lines, and wherein said at least one tuning circuit independently alters, for each respective clocked intermodule communication line, at least one characteristic of signals received on said respective clocked intermodule communication line.

18. The circuit card assembly of claim 13, wherein said at least one clocked intermodule communication line comprises at least one clocked intermodule bi-directional communication line, said circuit card assembly further comprising:
   comparison logic in said first module which compares a deterministic pseudo-random pattern generated by said second test pattern generator and transmitted from said second module to said first module across at least one clocked intermodule bi-directional communication line with a deterministic pseudo random pattern generated by said first test pattern generator; and
   logging logic in said first module which records the occurrence of any miscompares in said comparison logic.

19. An integrated circuit module for a digital data system, comprising:
   an intermodule interface for communicating with at least one other integrated circuit module of said digital data system, said intermodule interface comprising at least one clocked intermodule communication line connection;
   a test pattern generator for generating a deterministic pseudo-random pattern;
   comparison logic which compares test data generated by another intergrated circuit module and received by said intermodule interface over said at least one clocked intermodule communication line with said deterministic pseudo random pattern generated by said test pattern generator; and
   logging logic which records the occurrence of any miscompares in said comparison logic.

20. The integrated circuit module for a digital data system of claim 19, wherein said integrated circuit module comprises a programmable central processing unit for a computer system.

21. The integrated circuit module for a digital data system of claim 19, further comprising a test cycle counter which records a number of test cycles.

22. The integrated circuit module for a digital data system of claim 19, wherein said intermodule interface comprises a plurality of clocked intermodule communication line connections, and wherein said logging logic comprises selection logic for selectively recording the occurrence of miscompares in arbitrary subsets of said plurality of clocked intermodule communications line connections.

23. The integrated circuit module for a digital data system of claim 19, wherein said comparison logic further comprises mask logic which selectively masks miscompares at a specified logic level.

24. The integrated circuit module for a digital data system of claim 19, further comprising:
at least one line tuning circuit which selectively alters at least one characteristic of signals received at said at least one clocked intermodule communication line connection.

25. The integrated circuit module for a digital data system of claim 24, wherein said intermodule interface comprises a plurality of clocked intermodule communication line connections, and wherein said at least one tuning circuit independently alters, for each respective clocked intermodule communication line connection, at least one characteristic of signals received on said respective clocked intermodule communication line.

26. The integrated circuit module for a digital data of claim 24, wherein said at least one line tuning circuit comprises a variable delay circuit.

27. The integrated circuit module for a digital data system of claim 24, wherein said at least one line tuning circuit comprises a variable reference voltage circuit.

28. The integrated circuit module for a digital data system of claim 24, further comprising:
at least one clock tuning circuit which selectively alters at least one characteristic of a clock signal line for said at least one clocked intermodule communication line, said clock tuning circuit altering said at least one characteristic of a clock signal line independently of said line tuning circuit.

29. The integrated circuit module for a digital data processing system of claim 24, wherein said at least one clocked intermodule communication line comprises at least one clocked intermodule bi-directional communication line, said integrated circuit module further comprising a variable power driver circuit for driving said bi-directional communication line.

30. A method for characterizing an inter-chip interface, comprising the steps of:
(a) simultaneously generating a first pseudo random data pattern in a first integrated circuit module and a second pseudo random data pattern in a second integrated circuit module, said first and second pseudo random data patterns being identical;
(b) transmitting said first pseudo random data pattern from said first module to said second module over at least one clocked inter-module communication line;
(c) comparing said first pseudo random data pattern received by said second module over said at least one clocked inter-module communication line with said second pseudo random data pattern generated in said second module, said comparison being performed by said second module; and
(d) logging any miscompares between said first pseudo random data pattern and said second pseudo random data pattern, said logging step being performed by said second module.

31. The method for characterizing an inter-chip interface of claim 30, wherein said steps (a) through (d) are performed multiple times, each time corresponding to a different respective value of a tuning parameter of said at least one clocked inter-module communication line, to determine an error rate as a function different values of said tuning parameter.

32. The method for characterizing an inter-chip interface of claim 31, wherein said tuning parameter comprises a time delay of a receiver circuit in said second module.

33. The method for characterizing an inter-chip interface of claim 31, wherein said tuning parameter comprises a reference voltage of a receiver circuit in said second module.

34. The method for characterizing an inter-chip interface of claim 31, wherein said tuning parameter comprises a driver power of a driver circuit in said first module.

35. The method for characterizing an inter-chip interface of claim 30, further comprising the step of:
(e) setting a counter in said second module to count a pre-determined number of cycles, and automatically stopping said logging step (d) when said pre-determined number of cycles is reached.

36. The method for characterizing an inter-chip interface of claim 30, wherein said steps (a) through (d) are performed during a product design phase for a digital data processing device.

37. The method for characterizing an inter-chip interface of claim 30, wherein said steps (a) through (d) are performed during a manufacturing process to determine at least one optimal tuning parameter value on an individual basis for individual manufactured digital data devices.

38. A digital data processing system, comprising:
at least one circuit card assembly for mounting electronic components and providing electrical connections to said components;
a first and a second integrated circuit module mounted to at said least one circuit card assembly;
at least one clocked intermodule communication line connecting said first and second integrated circuit modules;
a first test pattern generator in said first module for generating a deterministic test pattern, wherein said deterministic test pattern does not repeat in fewer than 500 bits;
a second test pattern generator in said second module for generating a deterministic test pattern, said patterns generated by said first and second generators being identical;
comparison logic in said second module which compares a deterministic test pattern generated by said first test pattern generator and transmitted from said first module to said second module across said at least one clocked intermodule communication line with a deterministic test pattern generated by said second test pattern generator; and
logging logic in said second module which records the occurrence of any miscompares in said comparison logic.

39. A method for producing a digital data processing device, comprising the steps of:
generating an initial design of said digital data processing device;
constructing a device in accordance with said initial design, said device having a plurality of integrated circuit modules mounted on at least one circuit card containing electrically conductive patterns, there being at least one clocked inter-module communication interface between a first set of at least some of said plurality integrated circuit modules;
characterizing error rates of said at least one clocked inter-module communication interface at a plurality of different tuning parameter values using embedded circuitry in said first set of integrated circuit modules, wherein said embedded circuitry simulates operating conditions, detects errors, and records errors; and determining a set of optimal tuning parameter values from said characterizing step.

40. The method for producing a digital data processing device of claim 39, wherein said steps of characterizing error rates and determining a set of optimal tuning parameters are performed during a product design phase for said digital data processing device, optimal tuning parameters thus established being used for multiple digital data processing devices.

41. The method for producing a digital data processing device of claim 39, wherein at least one optimal tuning parameter value is determined on an individual basis for individual manufactured digital data processing devices.

42. The method for producing a digital data processing device of claim 39, wherein said step of characterizing error rates comprises constructing at least one bathtub error rate curve from data obtained using said embedded circuitry.

43. The method for producing a digital data processing device of claim 39, wherein said tuning parameter comprises a variable time delay, said variable time delay being generated in a receiver circuit of an integrated circuit module which receives communications on said clocked inter-module communication interface.

44. The method for producing a digital data processing device of claim 39, wherein said tuning parameter comprises a variable reference voltage, said variable reference voltage being generated in a receiver circuit of an integrated circuit module which receives communications on said clocked inter-module communication interface.

* * * * *